United States Patent [19]

Koshishiba et al.

[11] Patent Number: 5,051,585
[45] Date of Patent: Sep. 24, 1991

[54] APPARATUS AND METHOD OF PATTERN DETECTION BASED ON A SCANNING TRANSMISSION ELECTRON MICROSCOPE

[75] Inventors: Hiroya Koshishiba; Satoru Fushimi, both of Yokohama; Yasuo Nakagawa; Kozo Nakahata, both of Chigasaki, all of Japan

[73] Assignee: Hitachi, Ltd., Tokyo, Japan

[21] Appl. No.: 373,223

[22] Filed: Jun. 28, 1989

[30] Foreign Application Priority Data

Jul. 1, 1988 [JP] Japan .................................. 63-162527

[51] Int. Cl.⁵ ............................................. H01J 37/28
[52] U.S. Cl. .................................. 250/306; 250/310; 250/311
[58] Field of Search ............... 250/306, 307, 309, 310, 250/311, 397

[56] References Cited

U.S. PATENT DOCUMENTS

| | | | |
|---|---|---|---|
| 4,031,391 | 6/1977 | Hoppe | 250/397 |
| 4,219,731 | 8/1980 | Migitaka et al. | 250/397 |
| 4,366,380 | 12/1982 | Mirkin | 250/307 |
| 4,539,593 | 9/1985 | Tutier et al. | 358/37 |
| 4,602,282 | 7/1986 | Kurono et al. | 358/110 |
| 4,814,615 | 3/1989 | Fushimi et al. | 250/311 |
| 4,894,540 | 1/1990 | Komatsu | 250/307 |

OTHER PUBLICATIONS

"Development of X-Ray Inspection System by E--Beam Probe", from Proceeding of the 101st Conference of the 132nd Committee on the Application of Charged Particle Beams to the Industry in Japanese Science Promotion Council, Nov. 1962, pp. 137-148.
"Microbeam Analysis" (Publication), pp. 199-206 and 141-162, 1980.

Primary Examiner—Bruce C. Anderson
Attorney, Agent, or Firm—Fay, Sharpe, Beall, Fagan, Minnich & McKee

[57] ABSTRACT

A pattern detection apparatus based on a scanning transmission electron microscope having an electron gun for generating and accelerating an electron beam, a plurality of convergent lenses for converging the electron beam, a deflection circuit for deflecting the electron beam so that it scans an object to be inspected, such as an X-ray mask, a detection circuit which receives electrons that have been dispersed and transmitted in the object and converts the detected electrons into an electrical signal, and an image forming circuit which forms a detected image of the object under test in response to the detected signal from the detection circuit and in synchronism with the deflection signal applied to the deflection circuit.

23 Claims, 18 Drawing Sheets

30KV

100KV

200KV

BN-BASED X-RAY MASK
(WITH 2μm POLYIMIDE PROTECTION FILM)

BN-BASED X-RAY MASK
(WITH 0.5μm POLYIMIDE PROTECTION FILM)

SiN-BASED X-RAY MASK
(WITH 2μm POLYIMIDE PROTECTION FILM)

SiN-BASED X-RAY MASK
(WITH 0.5μm POLYIMIDE PROTECTION FILM)

F I G. 7
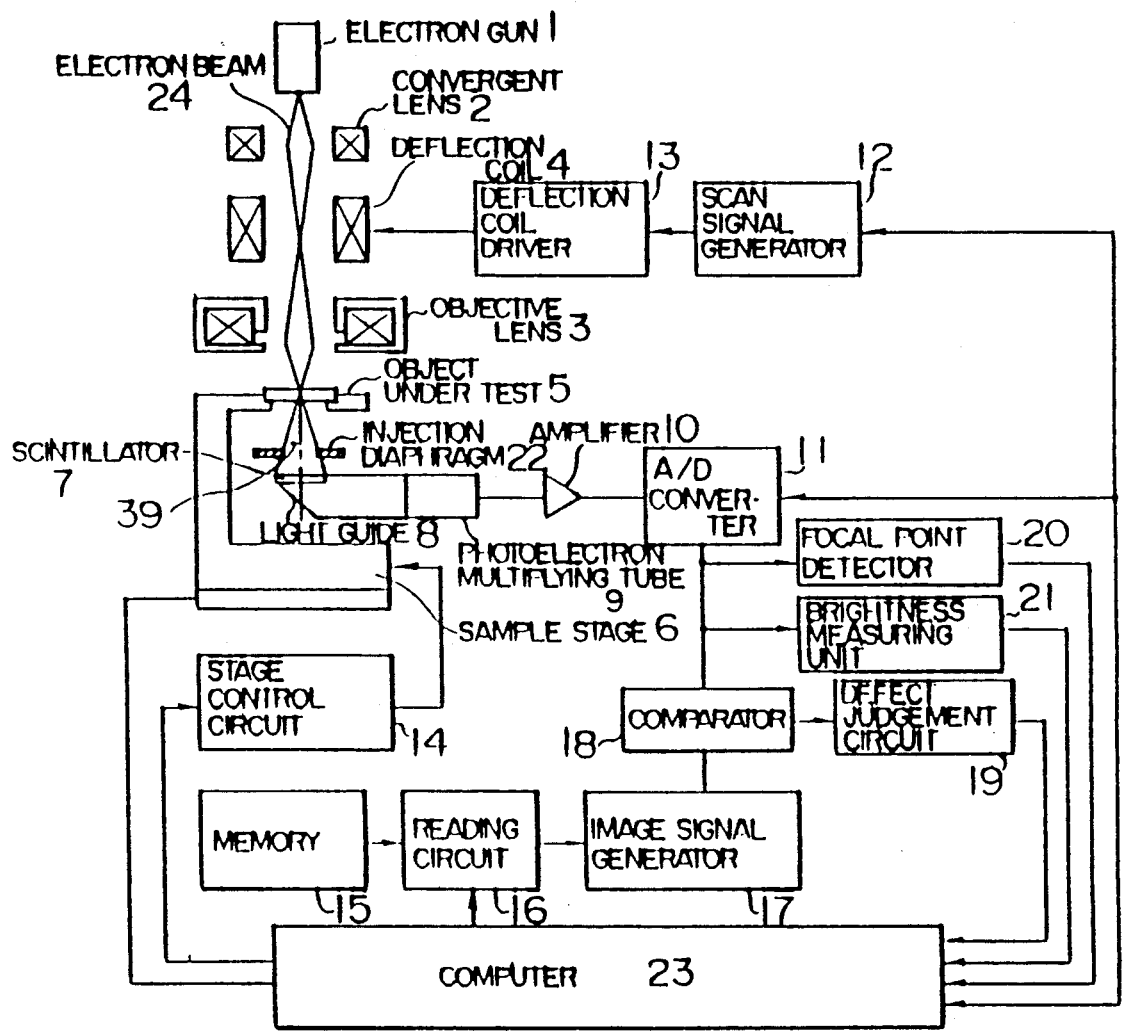

F I G. 17
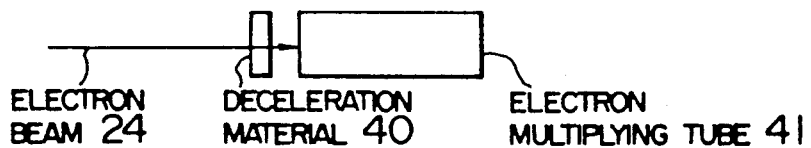
F I G. 18
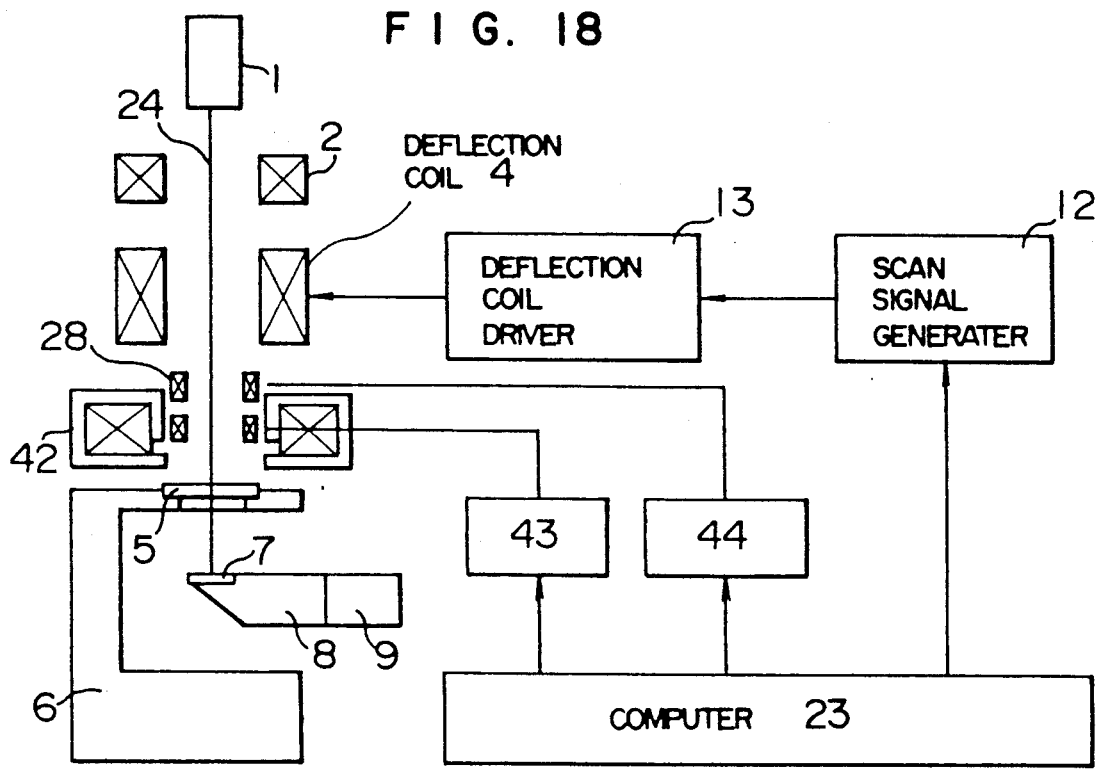
F I G. 19
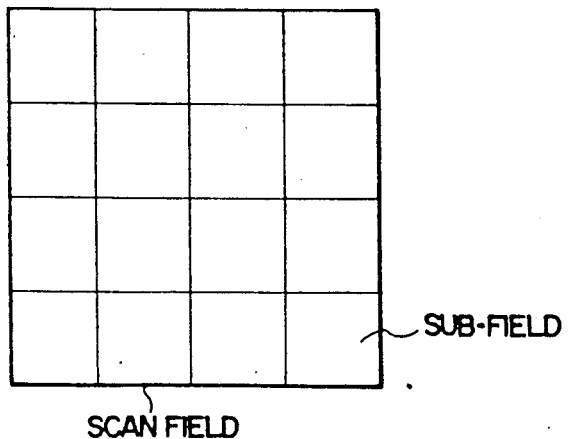

APPARATUS AND METHOD OF PATTERN DETECTION BASED ON A SCANNING TRANSMISSION ELECTRON MICROSCOPE

BACKGROUND OF THE INVENTION

This invention relates to an apparatus and method of pattern detection based on a scanning transmission electron microscope suitable for the inspection of circuit patterns formed on a semiconductor device and mask, particularly circuit patterns formed on a mask used for the X-ray exposure.

There have been used scanning electron microscopes (SEM) or scanning transmission electron microscopes (STEM) as apparatuses for detecting microscopic structures. A pattern detecting apparatus based on SEM is described in the proceeding of the 101-th conference of the 132-th committee on the application of charged particle beams to the industry in Japanese Science Promotion Council, pp. 37–148, for example.

STEM includes imaging methods of bright field imaging, dark field imaging, Z-contrast method and element imaging, as described in the publication MICROBEAM ANALYSIS, pp. 199–206, for example.

The bright field imaging is designed to detect electrons that do not disperse by setting the opening angle of the detector to about $10^{-4}$ rad. In the case of an X-ray mask, electrons are prone to disperse more on the pattern than on the substrate, and therefore the pattern is detected darkly.

The dark field imaging is a method for detecting only electrons dispersed on an object under test. Because of the detection of electrons dispersed on a pattern, the pattern is detected brightly.

The Z-contrast method detects separately dispersing electrons and electrons that do not disperse. Thus, this method makes a contrast which depends on the atomic number from the ratio of the detected signals. The contrast is determined from the ratio of atomic numbers of the element that constitutes the pattern and the element that constitutes the substrate.

The element imaging is to measure the distribution of electron energy that is lost in an object under test. The method is capable of detecting elements having inherent values of energy loss.

Electron beam detectors used in the SEM and STEM are based on either the method of detection with a scintillator and photoelectron multiplier and the method of detection with a semiconductor detector, as described in MICROBEAM ANALYSIS, pp. 141–162.

The above-mentioned pattern detecting apparatus based on SEM involves the charge-up phenomenon when the object under test is an insulator, which in this case does not permit accurate pattern detection.

The above-mentioned imaging method of STEM provides a satisfactory contrast for a thin object under test with a thickness of about 1 $\mu$m or less, in which part of the electrons are dispersed inside the object and the remaining electrons are not dispersed, while it suffers a poor contrast for a thick object under test of about 1 $\mu$m or more in which most of electrons are dispersed in the object.

Conventional STEM apparatuses use objective lenses of the in-lens type, and therefore they are limited in the size of objects to be tested.

In addition, conventional electron beam detectors used in SEM and STEM have detection clock frequencies of about 4 MHz at most, and therefore the detection time cannot be reduced.

SUMMARY OF THE INVENTION

An object of this invention is to provide an apparatus and method of pattern detection based on a scanning transmission electron microscope capable of detecting a pattern accurately without being affected by charges even for an insulator as an object to be tested.

Another object of this invention is to provide an apparatus and method of pattern detection based on a scanning transmission electron microscope capable of fast pattern inspection through the high-contrast pattern detection for a thick object under test in which most of electrons are dispersed inside the object.

A further object of this invention is to provide an apparatus and method of pattern detection based on a scanning transmission electron microscope capable of pattern detection even for large objects under test having sizes of several tens of millimeters.

A further object of this invention is to provide a fast-operating electron beam detector with the intention of accomplishing a pattern detection apparatus based on a high-speed scanning transmission electron microscope, and to provide an image restoration method which recovers the deterioration of signal waveform caused by the delay a response of the electron beam detector.

A further object of this invention is to provide a fast-operating pattern inspection apparatus using a pattern detection apparatus based on a scanning transmission electron microscope.

A further object of this invention is to provide an X-ray mask suitable for a pattern detection apparatus based on a scanning transmission electron microscope.

A further object of this invention is to provide a method of pattern detection based on a scanning transmission electron microscope capable of measuring the dimensions of a pattern.

A further object of this invention is to provide a method of pattern detection based on a scanning transmission electron microscope capable of measuring the thickness of a pattern.

A further object of this invention is to provide a method of pattern detection based on a scanning transmission electron microscope capable of detecting extraneous substances.

With the electron acceleration voltage being set sufficiently high so that electrons incident to an object under test are transmitted without being absorbed inside an object, a pattern of object can be detected accurately without the influence of charges even when testing an insulating object.

By detecting electrons that have passed through an object under test in a wide range, i.e., electrons dispersed on a pattern and electrons dispersed on the substrate, thereby to have a contrast based on the difference in dispersion angle distribution between electrons dispersed on the pattern and electrons dispersed on the substrate, high contrast detection is accomplished.

By adoption of an objective lens of the out-lens type for the STEM and mounting of an object to be tested on a large sample stage, detection for a large object is made possible.

By using an electron multiplying tube, with a decelerating material being disposed at the front, for the electron beam detector, high-acceleration electrons can be detected efficiently and in a short time.

With the inventive scanning transmission electron microscope being added by an auto-focusing mechanism, auto-feed sample stage and image processor for the result of detection, the functions of pattern inspection, pattern dimension measurement, pattern thickness measurement, and extraneous substance are possible inspection.

An electron incident to an object under test changes its moving direction through iterative elastic and nonelastic dispersions in the material and loses its energy progressively. An electron having a low acceleration voltage repeats dispersion until it loses all energy in the object, and finally it is absorbed in the object and the object is charged. An electron having a high acceleration voltage jumps out of the object before it loses energy and the object is not charged, allowing stable pattern detection without the influence of charges.

Next, for an X-ray exposure mask as an object to be tested, the acceleration voltage at which charges are not stored in the mask will be shown. FIG. 1 shows the cross-section of the X-ray mask. A membrane 524 made of material which is highly transmissible for the X-ray is overlaid by a pattern 525 made of material which is resistive against the transmission of X-ray, and in some cases the surface is coated with a thin film 526 for the purpose of protecting the pattern 525. The membrane is formed of a composed film made up of BN with a thickness of 2 $\mu$m and polyimide with a thickness of 3 $\mu$m, and the pattern is formed of Au with a thickness of 1 $\mu$m, which is coated with a polyimide protection film to complete an X-ray mask. FIG. 2 shows the result of a computer simulation, based on the Monte Carlo method, for the dispersion process of the electron beam in the X-ray mask. At an acceleration voltage of 30 kV, electrons are absorbed in the Au pattern, and the mask is expected to be charged. In fact, when the SEM was operated at an acceleration voltage of 30 kV, the X-ray mask was charged and the pattern could not be detected satisfactorily. At an acceleration voltage of 100 kV, electrons are not absorbed although they are dispersed prominently by the Au pattern. In fact, when the STEM was operated at an acceleration voltage of 100 kV, the influence of charges was not encountered and the pattern could be detected stably.

With the acceleration voltage being raised to 200 kV, the beam flares less in the protection film and the pattern can be detected at a higher resolution. With an acceleration voltage of 75 kV or higher, the X-ray mask is not charged and the pattern can be detected stably.

FIG. 3 shows the distribution of dispersion angles of electrons in the pattern and membrane. Electrons are dispersed more prominently in the pattern layer than in the membrane. The following describes a method of a well contrasted pattern detection which utilizes the difference in the dispersion angle distribution between the pattern and membrane. When the detector detects electrons having dispersion angles from 0 to $\theta$ (will be termed "detection angle of $\theta$"), the detected signal has a value which is the integration of the dispersion distribution curve from 0 to $\theta$, i.e., the detected signal for the pattern is an area defined by the curve OB'A, line OA' and line AA', and the detected signal for the membrane is an area defined by the curve OBA, line OA' and line AA'. The contrast is given as a difference between the detected signals for the membrane and pattern, i.e., an area defined by the curves OBA and OB'A. The next case is a detection angle of $\phi$. The detected signal for the membrane is an area defined by the curve OB, line OB" and line BB", the detected signal for the pattern is an area defined by the curve OB', line OB" and line BB", and the contrast is the difference of these signals, i.e., an area defined by the curve OB, curve OB" and line BB'. This area is smaller than that of the contrast for the detection angle $\theta$ by the area defined by the line BB', curve BA and curve B'A. Namely, it was revealed that the contrast of the detection angle $\phi$ is smaller than that of the detection angle $\theta$. Similarly, the contrast of a detection angle $\phi$ is given as an area defined by the curve BA and curve OB'A subtracted by an area defined by the curve AC, curve AC' and line CC', and therefore it is smaller than the constant for the detection angle $\theta$. From the above discussion, it is concluded that the detection angle $\theta$ provides the maximum contrast. Accordingly, the pattern can be detected at a satisfactory contrast by detecting electrons having dispersion angles from 0 to $\theta$.

Next, a specific example of the detection angle $\theta$ will be described. FIGS. 4A to 4D show the distributions of dispersion angles in the pattern and membrane of X-ray masks, as an object to be tested, evaluated by the simulation of electron dispersion based on the Monte Calro method. The simulation was conducted for the case of an electron acceleration voltage of 200 kV for two kinds of X-ray masks. One X-ray mask is a composed film of a BN with a 2 $\mu$m thickness and polyimide with a thickness of 3 $\mu$m, and the pattern is formed of Au with a thickness of 2 $\mu$m. Another X-ray mask is made of SiN membrane with a thickness of 2 $\mu$m, and the pattern is formed of Ta with a thickness of 0.75 $\mu$m. The protection film on polyimide is assumed to have thickness of 2 $\mu$m and 0.5 $\mu$m, respectively, in the computation. FIGS. 4A-4D reveal that the maximum contrast is obtained at a detection angle of about 0.2 rad, although it varies to some extent depending on the structure of X-ray mask. This value is incomparably larger than the detection angle of the conventional STEM. The detection angle $\theta$ depends on the electron acceleration voltage, having a smaller value for a higher acceleration voltage and a larger value for a lower acceleration voltage. A proper value is in the range from 5° to 25°, approximately.

FIGS. 5A and 5B show the measured values which represent the relation between the contrast and the detection angle. Shown in FIG. 5B is a graph which is equivalent to the result of integration of FIGS. 4A-4D. The contrast, which is the difference between the substrate signal and pattern signal, has a maximum value at a detection angle of about 0.2 rad, according to the measurement, as expected by the simulation.

As the contrast rises, the SN ratio of the detected signals is also improved. FIGS. 6A and 6B show an example of S/N ratio improvement based on different detection angles. It was confirmed that the present invention enhances the SN ratio by 10 fold or more as compared with the conventional case.

Owing to the enhanced SN ratio, the detection speed can be raised. The conventional electron beam detector has a detection clock frequency of about 4 MHz. Although detection speed can be raised by using an electron multiplying tube, the sensitivity of detection for high-acceleration electrons is low, and it cannot be used for STEM. By placing a deceleration material at the front of the electron multiplying tube, so that energy of electrons diminish, thereby increasing the creation of secondary electrons from the first-stage diode, the sensitivity of detection can be raised.

The inventive image restoration method and pattern external view inspection apparatus based on the scanning transmission electron microscope is intended to remove a deteriorated image with a dull waveform caused by the delay of response of the image detection system by modeling the transfer function of the image detection system and describing the model in the form of sum and product of first-order delay elements. Since constituent elements of the electron beam detecting system including a scintillator, photoelectron multiplying tube and semiconductor detector, for example, can be approximated accurately in the form of a first-order delay element or the sum of first-order delay elements, by implementing the signal processing in accordance with the differential equation obtained through the inverse Laplace transformation of the inverse function of the transfer function, thereby recovering the deterioration of a detected waveform. This signal processing results in increased noises in the image, and therefore a smoothing process is conducted in advance for the detected image thereby to suppress the increase of noises caused by the restoration of the detected waveform, and because most of the noises in the detected image are created before the image detection system, they include less high-frequency components and therefore cannot be eliminated with a high-frequency cut filter. To cope with this matter, by noticing the small amplitude of noises, a smoothing filter is activated when the variation of signal level in a local region is small or the original signal is delivered directly when the signal level varies greatly, as a smoothing process for the detected image, and by implementing the restoration process for the detected waveform following the smoothing process, a restored image including less noises is obtained. Scanning an image detecting apparatus, such as a laser scanning electron microscope, external view inspection apparatus and extraneous substance inspection apparatus, using the inventive point sensor imaging means operates to recover the deterioration of a detected waveform in the same manner by obtaining in advance; the transfer function of the image detecting system including a photodetector or photoelectron multiplying tube and by implementing signal processing in accordance with the differential equation obtained by the Laplace transformation of the inverse function of the transfer function. In eliminating noises in the detected signal, a smoothing process is conducted prior to the restoration process.

In the foregoing image restoration method and pattern external view inspection apparatus based on the scanning transmission electron microscope, a deteriorated image signal y(t) is rendered a Laplace transformation Y(s) for the transfer function G(s) of image detection system in terms of the Laplace transformation X(s) of the original image signal x(t) as follows.

$$Y(s) = G(s) \cdot X(s) \tag{1}$$

Using the inverse function 1/G(s) of G(s), the original image can be restored from the deteriorated image as follows.

$$X(s) = \frac{1}{G(s)} \cdot Y(s) \tag{2}$$

This restoration process is a computation on the Laplace transformation plane (Fourier transformation plane), and 1/G(s) is called an inverse filter. The restoration based on the inverse filter necessitates Fourier transformation for the image, activation of the inverse filter, and inverse Fourier transformation for image restoration, and the volume of computation is too large to be suited for the real time processing. Proposed besides the inverse filter are various filters such as a Wiener filter, all of which involve computations on the Fourier transformation plane, and therefore they require a large volume of computation. Another proposal is image restoration based on the iteration method, but this successive approximation method imposes a large volume of computation, making the real time process difficult. Equation (2) is not generally rendered the analytical Laplace transformation, but it is made possible by expressing the G(s) in such a specific form as an integral element, differential element or first-order delay element. By approximating the transfer function of the constituent elements of the electron beam detecting system, such as the scintillator, photoelectron multiplying tube and semiconductor electron beam detector, as a sum of first-order delay elements, the transfer function of the whole electron beam detecting system becomes the sum and product of first-order delay elements. As a simple example, the G(s) is assumed to be a first-order delay element as follows.

$$G(a) = \frac{1}{\tau s + 1}, \tag{3}$$

where $\tau$ is the time constant. Equation (2) is rendered the inverse Fourier transformation as follows.

$$x(t) = \tau y'(t) + y(t) \tag{4}$$

Then it is restored as a sum of the differential signal of the deteriorated image and the signal of the deteriorated image. The differential of this signal can be calculated as a difference, which requires a small volume of computation, and the real time process is possible. The restoration by equation (4) includes the differentiation process, which increases noises, and it is effective for suppressing the increase of noise to perform a prior smoothing process for the deteriorated image. In this case, if an averaging filter or center value filter is used to smooth the entire frame of the deteriorated image, effective signal components are also weakened along with noises, and it is not possible for the restoration process to restore a completely deterioration-free original image. A high-frequency cut filter cannot eliminate noises, since most noises are created before the detection system and the noises have little high-frequency components. On this account, by noticing the small amplitude of noises, a smoothing filter is activated when the variation of the signal level in a local region is small or the original signal is delivered directly when the signal level varies greatly, as an effective smoothing process. In this manner, for the electron beam detection signal of the pattern external view inspection apparatus based on the scanning transmission electron microscope, the restoration process which is represented by the equation (4) is conducted after the nonlinear smoothing process. In this manner, a restored image including little noise can be obtained, and fast detection is made possible.

BRIEF DESCRIPTION OF THE DRAWINGS

FIG. 7 is a block diagram showing an embodiment of the pattern inspection apparatus using the inventive scanning transmission electron microscope;

FIG. 17 is a diagram showing the electron beam detector in the electron multiplying tube which is applied to the inspection apparatus of FIG. 7;

FIG. 18 is a diagram showing the dynamic focusing and dynamic stigma correction device applied to the inspection apparatus of FIG. 7;

FIG. 19 is a diagram showing the scanning fields of the dynamic focusing and dynamic stigma correction;

DESCRIPTION OF THE PREFERRED EMBODIMENTS

Figure 1:
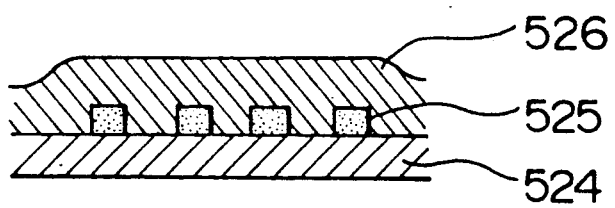
FIG. 1 is a cross-sectional diagram of an X-ray mask.
Figure 3:
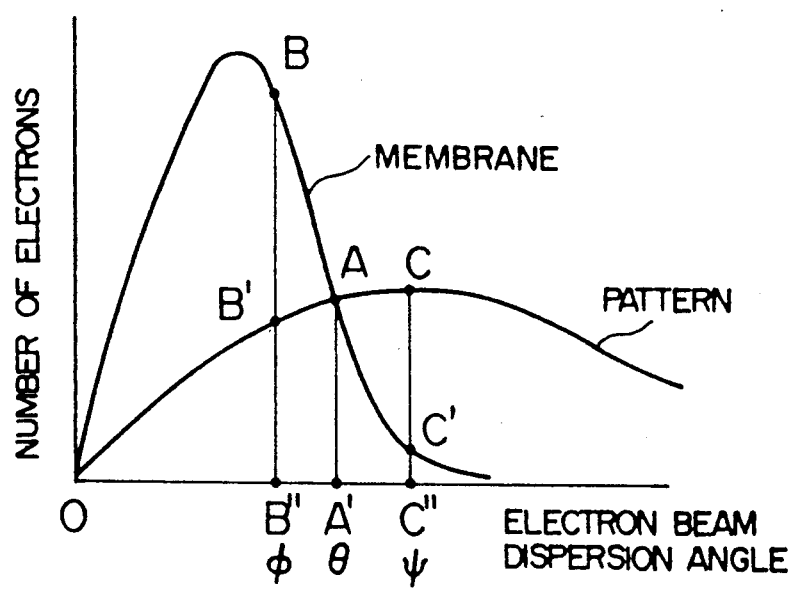
FIG. 3 is a graph showing the optimal detection angle which provides the maximum detection contrast.
Figure 2A:
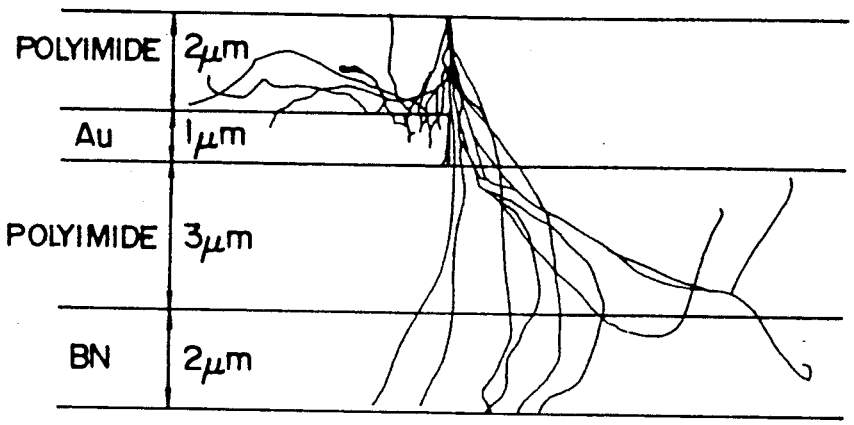
FIGS. 2A–2C are diagrams showing traces of electron dispersion in the X-ray mask.
Figure 2B:
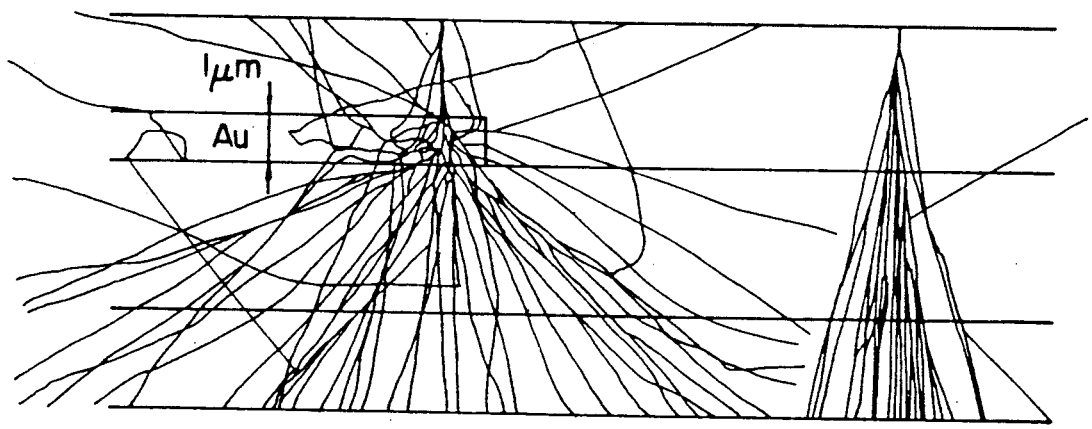
Figure 2C:
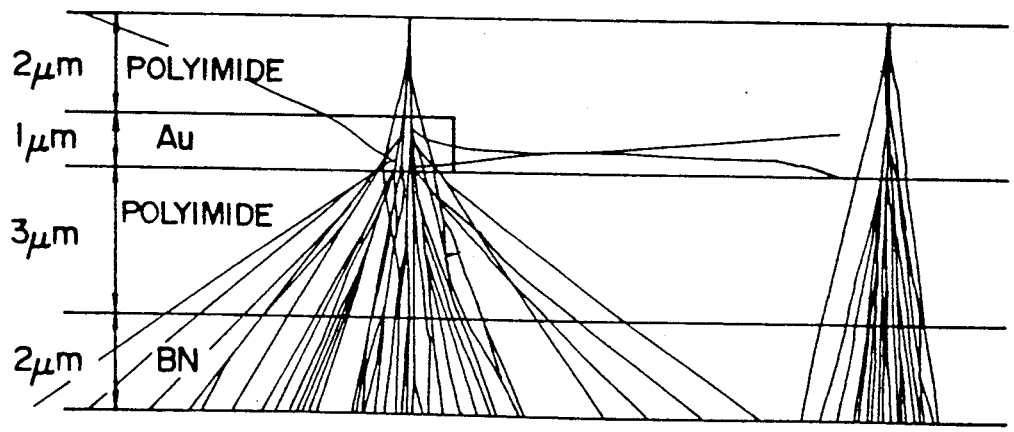
Figure 4A:
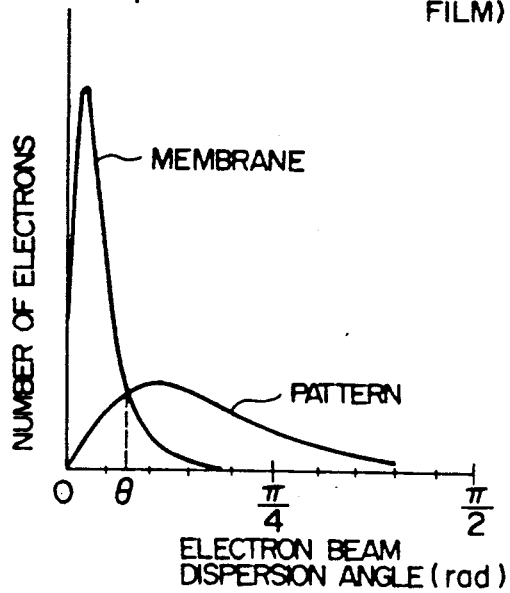
FIGS. 4A-4D are graphs showing the distributions of electron dispersion in the X-ray mask.
Figure 4B:
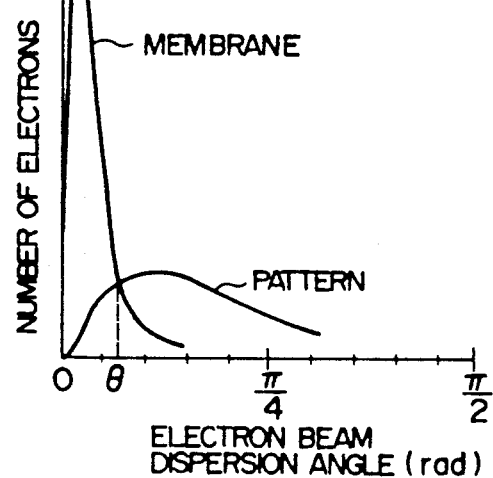
Figure 4C:
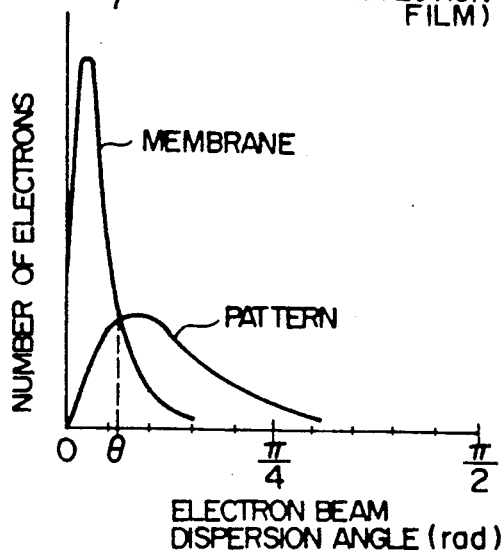
Figure 4D:
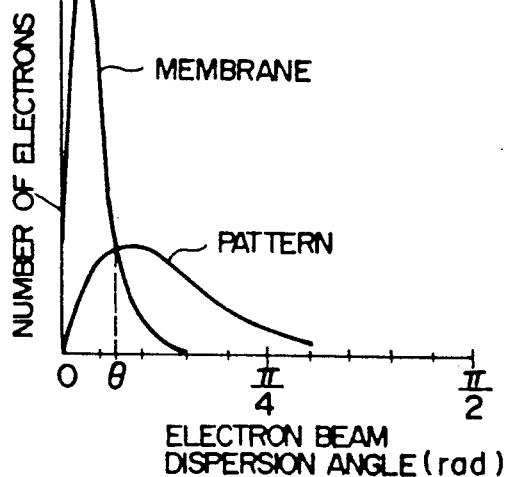
Figure 5A:
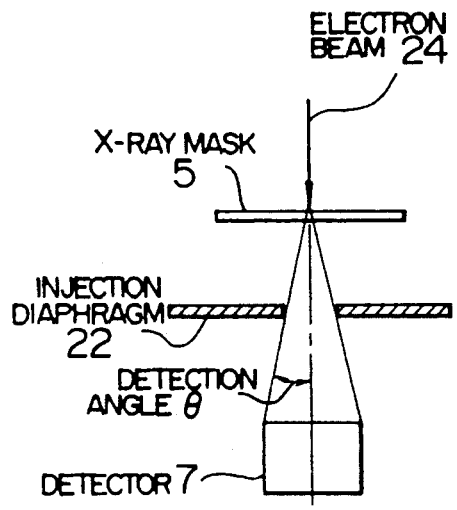
FIGS. 5A and 5B are diagrams showing measured values of the optimal detection angle which provides the maximum detection contrast.
Figure 5B:
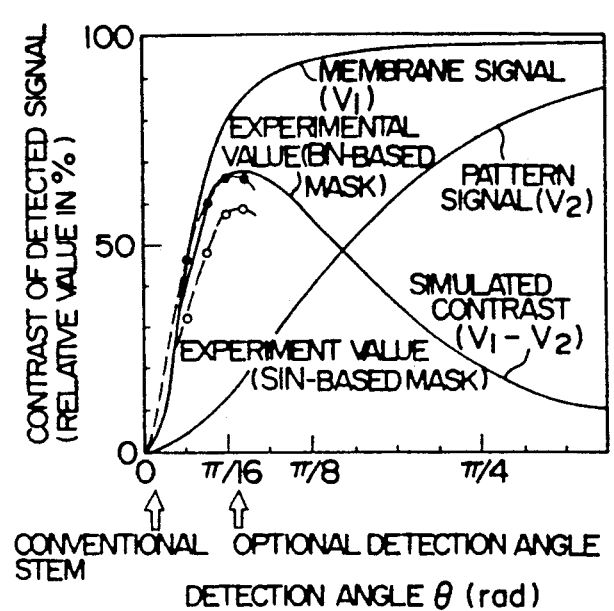
Figure 6A:
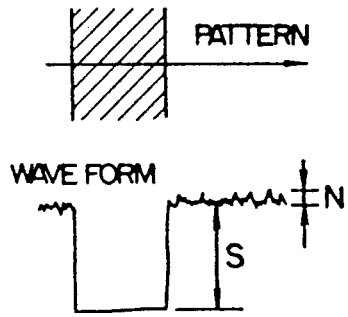
FIGS. 6A and 6B are diagrams showing the improvement of S/N achieved by the optimal detection angle.
Figure 6B:
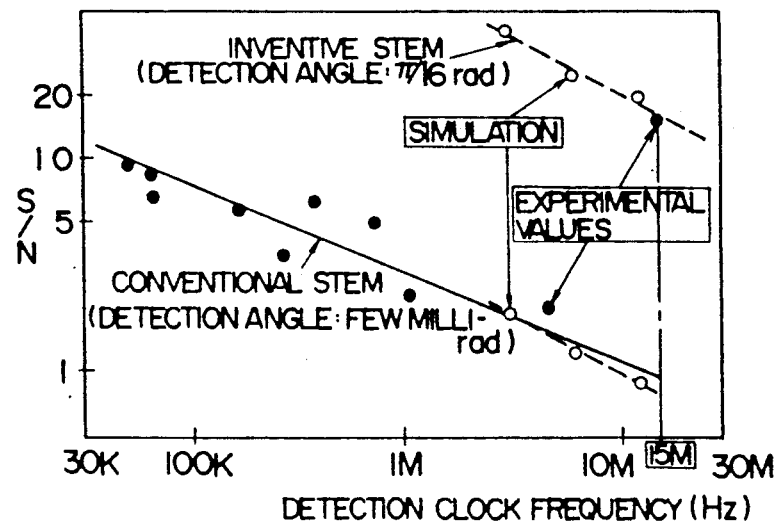

An embodiment of this invention will be described with reference to FIG. 7. The inventive pattern inspection apparatus comprises an electron gun 1, a convergent lens 2, an objective lens 3, a deflection coil 4, an object under test 5, a sample stage 6, a scintillator 7, a light guide 8, a photoelectron multiplying tube 9, an amplifier 10, an A/D converter 11, a scanning signal generator 12, a deflection coil driver 13, a stage controller 14, a memory 15, a reading circuit 16, an image signal generator 17, a comparator 18, a defect judgement circuit 19, a focal point detector 20, a brightness detector or brightness measuring unit 21, an injection diaphragm 22, and a computer 23.

An electron beam generated by the electron gun 1 is converged by the convergent lens 2 and objective lens 3 to form a spot on the object 5. The electron acceleration voltage is set sufficiently high so that the electron beam is transmitted through the object. When the object is an X-ray mask, the voltage is about 75 kV or higher.

The electron beam 24 is deflected to scan the object 5 by means of the deflection coil 4 which is driven by the deflection coil driver 13 is accordance with the signal from the scanning signal generator 12. Among electrons passing through the object 5, only electrons passing through the injection diaphragm 22 which is set at the optimal detection angle to maximize the detected signal contrast are detected by the scintillator 7. Since the scintillator 7 also detects the X-rays, the diaphragm 22 is preferably made of material which produces less of an amount of X-rays when excited by the electron beam, e.g., carbon. It is also possible to obtain the optimal detection angle by adjusting the detection area of the scintillator 7 or the distance between the object 5 and the scintillator 7. In order for the apparatus to deal with several types of objects 5, the diaphragm 22 is designed to be interchangeable to provide different diaphragm diameters, it is designed to be movable in the vertical direction, or it is designed to vary the diaphragm diameter, preferably. The electron beam is converted into the light by the scintillator 7, and it is led by the light guide 8 to the photoelectron multiplying tube 9, by which the light is converted into an electrical signal. The electron beam detector is not confined to the method of detection with the scintillator and electron multiplying tube, but it is also possible to use a semiconductor detector, for example. The electrical signal produced by the photoelectron multiplying tube 9 is amplified by the amplifier 10, synchronized with the scanning signal, and quantized by the A/D converter 11 to produce a scanning transmission electron image (STEM image).

In parallel to the detecting operation, the design data which has been used to draw the pattern of the object is read out of the memory 15 by the reading circuit 16, and a reference image at the position of detection is produced by the image signal generator 17. The signal is entered to the comparison circuit 18 in synchronism with the STEM image. The reference image and STEM image are subjected to position matching, and inconsistent portions are delivered to the defect judgement circuit 19. The defect judgement circuit 19 discriminates as defects, only inconsistent portions which are above an allowable level.

On completion of inspection for one field, the computer 23 issues a command to the stage control circuit 14 so that the sample stage 6 is fed by one step for the inspection of a new field. These operations are repeated until the entire surface of the object 5 is inspected. Instead of step-feeding the sample stage 6 for the inspection of the whole surface, the sample stage 6 may be moved at a constant speed so that it is scanned at right angles with the moving direction by the electron beam 24 which is deflected by the deflection coil 4.

Figure 8A:
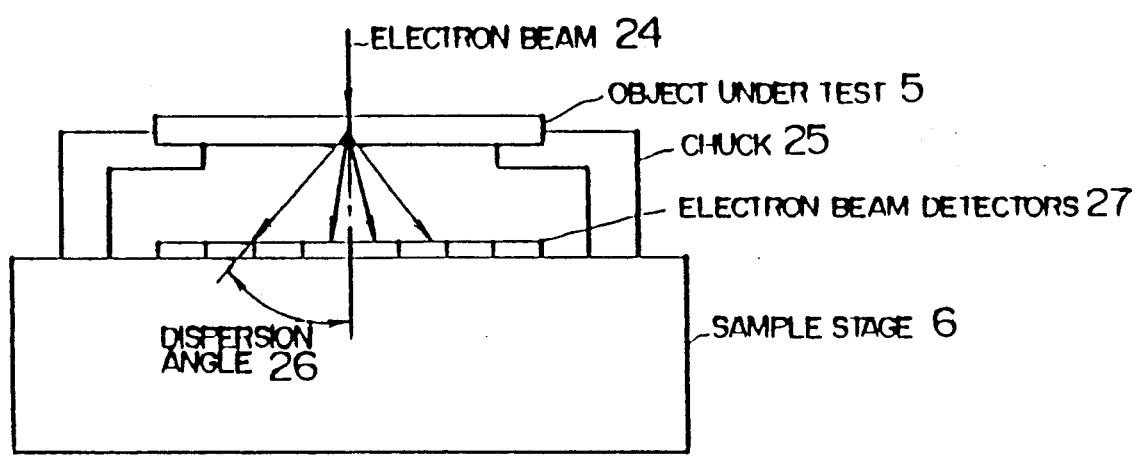
FIGS. 8A-8C are diagrams showing the structure of the electron beam detector which is applied to the inspection apparatus of FIG. 7.
Figure 8B:
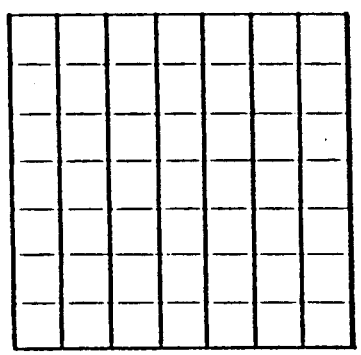
Figure 8C:
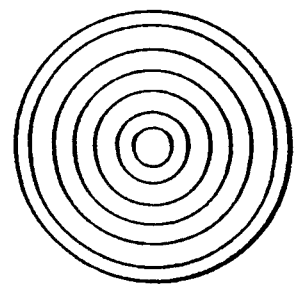

FIGS. 8A-8C show, as an example, the detection of only electrons with a specific dispersion angle by use of a plurality of electron beam detectors 27. An object under test 5 is fixed on the stage 6 by means of a chuck 25. The electron beam detectors 27 are mounted on the sample stage 6 in a matrix arrangement as shown in FIG. 8B. After being dispersed in the object 5, the electron beam 24 is detected by the electron beam detectors 27. The electron beam detectors 27 are semiconductor detectors, for example. By summing signals of specific detectors among the signals of all detectors, only electrons with a specific range of dispersion angle can be detected. Particularly, by summing the signals of detectors within a certain distance from the center of the electron beam 24, the same effect as the injection diaphragm as has been explained on FIG. 7 is achieved. By switching active detectors in response to the movement of the sample stage 6, the detection angle can be kept constant invariably. Moreover, by summing signals of detectors located at certain distances from the center of the electron beam 24, or by summing signals imposed by weights, the pattern contrast can be varied arbitrarily.

By placing the electron beam detectors 27 in a concentric arrangement as shown in FIG. 8C, with signals of certain detectors being sampled for summation and remaining signals being discarded, only electrons with a specific dispersion angle can be detected.

Figure 9:
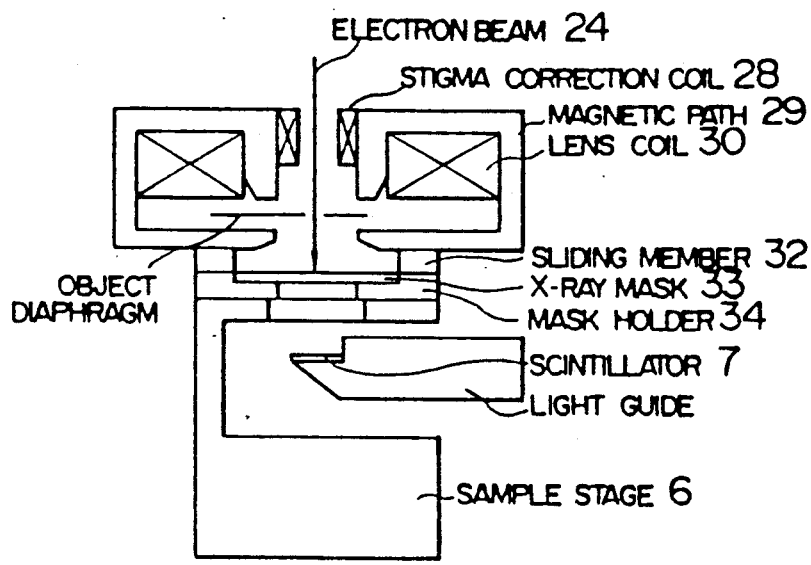
FIG. 9 is a diagram showing the objective lens of the out-lines type which is applied to the inspection apparatus of FIG. 7.

FIG. 9 shows the structure of the objective lens and sample stage in the pattern detector intended for X-ray masks having diameters of 2 inches, 3 inches or more. Since the conventional STEM is based on the in-lens system, in which a sample is placed in the polepiece of lens, allowing merely the inspection of objects with sizes of several millimeters at the most. Whereas, the inventive apparatus employs the out-lens system, in which a sample is placed outside of the magnetic path of the lens, with a large sample stage being disposed beneath the objective lens, thereby allowing the inspection of X-ray masks. The objective lens of the out-lens system is made up of a magnetic path 29 and a lens coil 30, with a stigma correction coil 28 being disposed inside the magnetic path 29. An X-ray mask 33 under test is encased in a mask holder 34 and held on the sample stage 6, which is movable in the X, Y, Z, θ and tilt directions. The x-ray mask 33 is detachable against the sample stage 6 while it is accommodated in the mask holder 34. The electron beam 24 has its irradiation angle $\alpha$ determined by the object diaphragm 31, and it forms a specified spot diameter and beam current on the X-ray mask 33. For example, using an objective lens with a magnetic pole aperture diameter on the beam upstream side, magnetic pole spacing, and pole aperture diameter on the beam downstream side of 30 mm, 11 mm and 24 mm, respectively, produces a beam spot diameter of 40 mm and a beam current of 5 nA in the case of an irradiation angle (half angle) of 7 mrad. Making the irradiation angle $\alpha$ larger increases the beam current, resulting in an improved SN ratio, while at the same time the beam diameter increases unfavorably due to the aberration of the lens. In order to reduce the detection time, a larger irradiation angle $\alpha$ for high S/N detection is much advantageous, whereas in order to detect small defects, a smaller irradiation angle $\alpha$ for small spot diameter is advantageous. In the case of an X-ray mask, minimal defects to be detected is conceivably 0.07 to 0.1 mm, which requires a spot diameter of 0.1 $\mu$m or less. However, excessive reduction in the spot diameter not only results adversely in a degraded SN ratio, but also in an enlarged beam diameter on the pattern due to the dispersion of electrons on the polyamide protection film on the X-ray mask, and the resolution of detection is not improved. Accordingly, it is favorable to gain the beam current by setting the spot diameter equivalent to a minimal defect to be detected or half that size.

The objective lens in the magnetic path 29 has a planar bottom surface, and a sliding member 32 fixed to the mask holder 34 and is pressed to the bottom surface of the magnetic path 29, thereby suppressing the mechanical vibration of the sample stage 6, and a stable detected image can be obtained. A possible method is to move the sample stage 6 while the sliding member 32 is pushed upward, or to lower the sliding member 32 for the movement of the sample stage 6 and to push it up at detection. The sliding member 32 is made of low-friction material, e.g., teflon, preferably. Another method is to fix the sliding member 32 to the upper surface of the sample stage 6 or the bottom surface of the objective lens in the magnetic path 29, instead of fixing it to the mask holder.

Figure 10A:
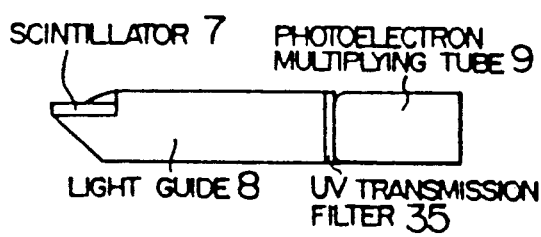
FIGS. 10A and 10B are diagrams showing the structure of connection between the scintillator and light guide which are applied to the inspection apparatus of FIG. 7.
Figure 10B:
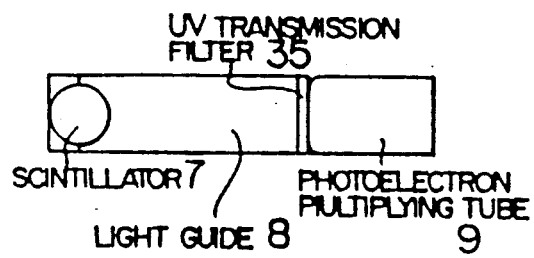

FIGS. 10A and 10B show the bonding section between the scintillator 7 and light guide 8 that are parts of the electron beam detector. FIG. 10A is the cross-sectional view and FIG. 10B is in the plan view. To increase the speed up of detection, a scintillator with a short afterglow time, e.g., monocrystal of yttrium aluminum perovskite (YAP), is effective. However, YAP has a high refraction factor of 1.96, and the scintillator irradiates much more light from the side surface than from the bottom surface. On this account, a cylindrical light guide is cut as shown in FIGS. 10A and 10B so that the scintillator is bonded at its bottom and side surfaces to the light guide, whereby the light radiation from the scintillator can be detected efficiently. The light guide 8, to which the scintillator is being bonded, is coated with aluminum excluding the contact surface with the photoelectron multiplying tube 9, thereby preventing the scintillator from charging, and the light correcting efficiency of the scintillator is enhanced.

Since the YAP radiation light is ultraviolet rays having a center wavelength of 380 nm, by inserting a UV transmission filter 35, which cuts off the visual rays and transmits the ultraviolet rays, between the light guide 8 and photoelectron multiplying tube 9, the influence of stray light originating from the laser length measuring unit 60 which measures the position of the sample stage 6 can be prevented.

Figure 11:
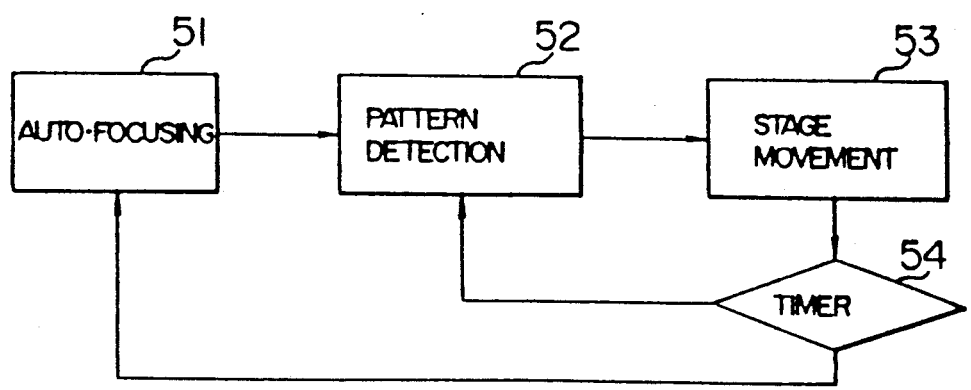
FIG. 11 is a block diagram showing the method of auto-focusing which is applied to the inspection apparatus of FIG. 7.

FIG. 11 shows in block diagram the method of automatic focusing. Step 51 focuses the electron beam on the entire surface of the X-ray mask, and thereafter step 52 detects patterns and step 53 moves the stage. The objective lens has a focal depth of 6 μm and the X-ray mask has a flatness of 1 μm, and therefore once the mask is focused the focus operation is not required any longer, provided that the sample stage is an ideal one. In reality, however, focusing needs to take place at a certain time interval in consideration of the parallelism of the sample stage and the stability of lens excitation current. Accordingly, step 54 is provided so that the pattern detection and stage movement are repeated for a certain period and then the automatic focusing is carried out at a certain interval, whereby patterns are always in focus for detection and the detection speed is not degraded since the focusing operation does not take place at each stage movement.

Figure 12:
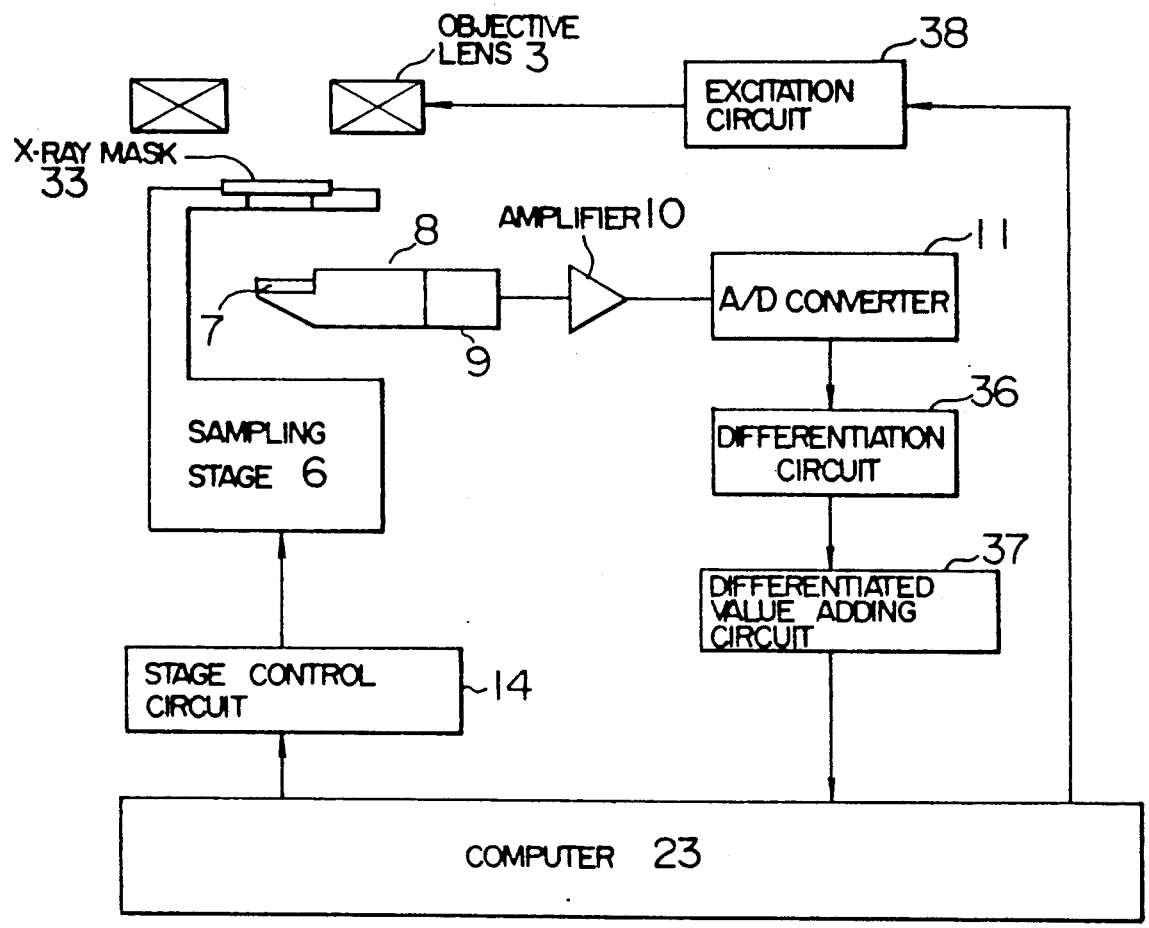
FIG. 12 is a block diagram showing the arrangement for carrying out the auto-focusing method shown in FIG. 11.
Figure 13A:
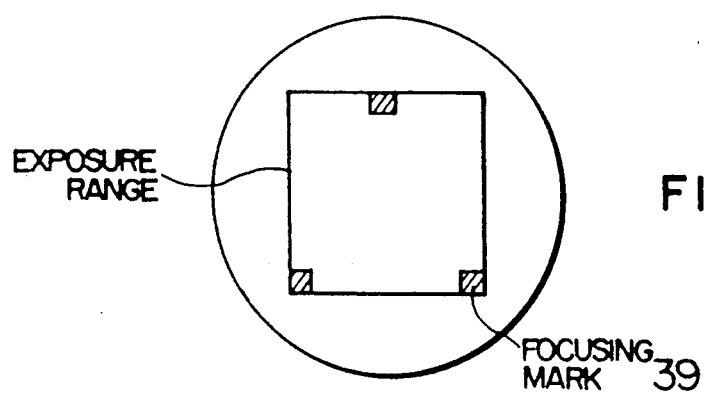
FIGS. 13A-13C are diagrams showing an X-ray mask suitable for the inspection apparatus which is provided with the auto-focusing function of FIG. 12.
Figure 13B:
Figure 13C:

FIG. 12 shows the auto-focusing mechanism, and FIGS. 13A, 13B and 13C show an X-ray mask suitable for the automatic focusing. FIG. 13A is a plan view showing the focusing mask position, and FIGS. 13B and 13C are plan views showing shapes of the focusing mark. The detecting apparatus has a focal depth of 6 μm, as compared with a 1 μm flatness of the X-ray mask in its exposure area. Therefore by adjusting the parallelism of the X-ray mask 33 by means of the tilt mechanism of the sample stage 6, the entire exposure area is rendered in-focus. For the X-ray mask 33, with three or more focusing marks being arranged as shown in FIG. 13A for example, a focusing mark is first detected, the detected waveform is differentiated by a differentiation circuit 36, differentiated waveforms of several lines are summed by a differentiated value adding circuit 37, the slope of the edge waveform of the focusing mark is measured, and the height of the sample stage is controlled so that the slope is steepest by the mountain climb method. Instead of controlling the height of the sample stage, the excitation circuit 38 may be controlled so as to control the focal distance of the objective lens. Next, the sample stage 6 is moved to the sample stage 6 is controlled so that the mark edge is steepest. In this manner, three focusing marks 39 on the X-ray mask are brought to in-focus, and consequently the entire exposure area is made in-focus. For the focusing based on the slope of the mark edge waveform, a rectangular mark as shown in FIG. 13B may be used. It is also possible to use a line-and-space mark as shown in FIG. 13C to implement focusing on the basis of the amplitude of detected waveform.

Figure 14:
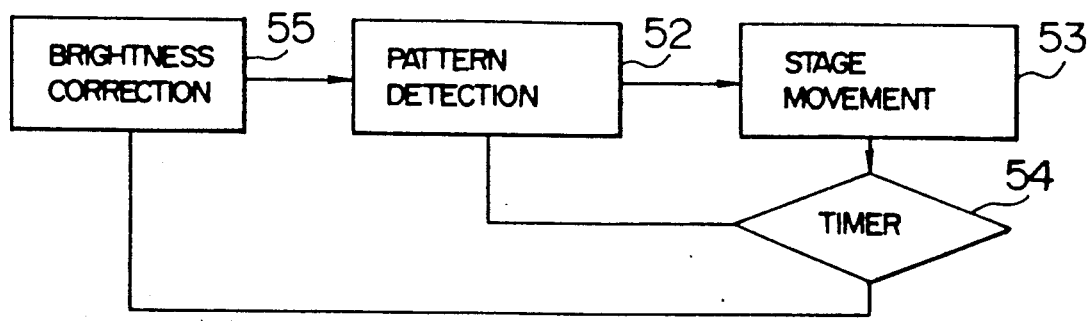
FIG. 14 is a block diagram showing the brightness correction device which is applied to the inspection apparatus of FIG. 7.

FIG. 14 shows a method of correcting a drift of brightness of the detected image. Causes of the variation in the brightness of the detected image area the drift of intensity of the electron gun 1 and the drift of amplifier 10. In the same manner as the auto-focusing method, step 54 repeats the pattern detection of step 52 and the stage movement of step 53 in a certain duration, and step 55 implements the brightness correction at a certain interval.

Figure 15:
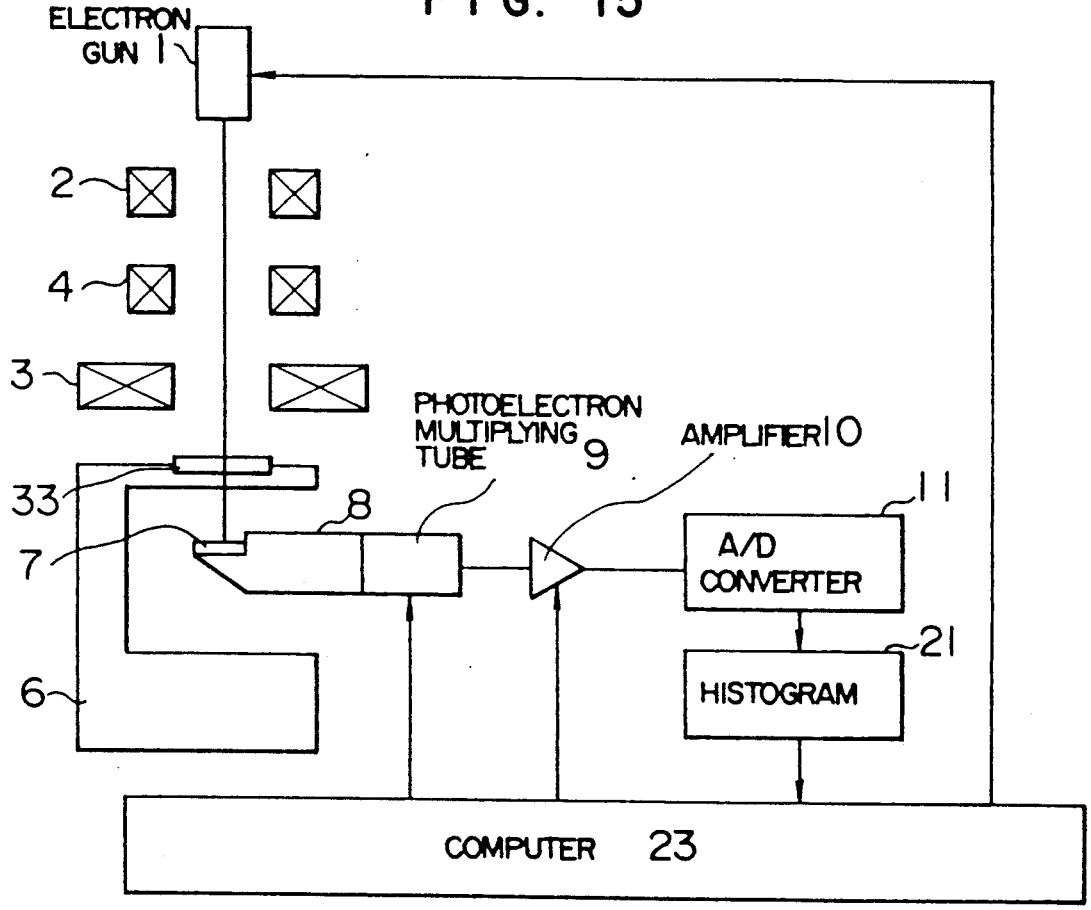
FIG. 15 is a diagram showing the arrangement of the brightness correction device shown in FIG. 14.
Figure 16:
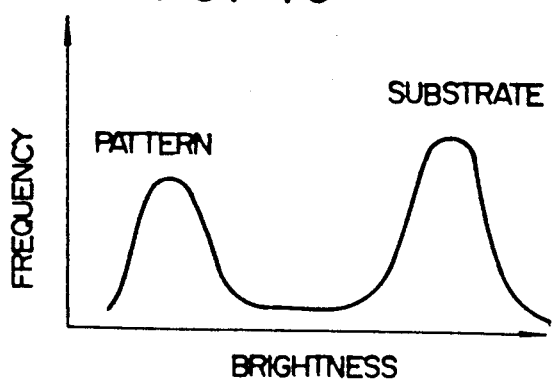
FIG. 16 is a histogram of an detected image.

FIG. 15 shows the brightness correcting mechanism. The detected signal provided by the photoelectron multiplying tube 9 is amplified and then quantized by the A/D converter 11, and the histogram of the detected image is measured by the brightness measuring unit 21. The histogram presents a double-peak distribution, indicating distinct brightnesses of the substrate and pattern. The brightness is corrected by controlling the supply voltage to the photoelectron multiplying tube 9 so that the peak brightness of the distribution is constant. Another control parameter, besides the supply voltage to the photoelectron multiplying tube 9, is the gain of the amplifier 10 or the intensity of the electron gun 1.

FIG. 17 shows an electron beam detector which detects the electron beam by using an electron multiplying tube 41. In case of detecting the electron beam 24 of a high acceleration voltage directly with an electron multiplying tube 41, the efficiency of secondary electron generation from the first-stage diode of the bute is too low to have a practical detection sensitivity. To cope with this matter, a deceleration material 40 for decelerating the electron beam is placed at the front of the electron multiplying tube 41 thereby to detect a lower-voltage electron beam, resulting in a higher efficiency of secondary electron generation of the diode and in an enhanced detection sensitivity. The deceleration material 40 is a material which produces less back scattering electrons, preferably carbon for example.

FIG. 18 shows the structure of the STEM which performs dynamic focusing and dynamic stigma correction. The electron beam 24 is swung by the deflection coil 4 to scan the object under test 5, and when the deflection angle increases the spot diameter expands due to the aberration of the objective lens 3. On this account, in order to maintain a certain resolution over the entire scanning range, an astigmatism correction coil 28 and moving focal point correction coil 42 are activated to correct the astigmatism and out-focus. Because of a high acceleration voltage of the electron beam 24, the astigmatism correction coil 28 and moving focal point correction coil 42 must be powerful, causing both coils to be high impedance, which makes fast correction difficult. To cope with this matter, the scanning field is divided into several sub-fields as shown in FIG. 19, and each sub-field is scanned by the electron beam 24 by being rendered a unique correction value for its interior. Although the variability of correction value within a sub-field is ignored, correction values for close points have little difference and therefore it is permissible in a practical sense. For the accomplishment of this correction method, a scanning signal generator 12 is designed to generate a sawtooth wave which is biased with a d.c. component in correspondence to each sub-field, and a moving focal point correction driver 43 and astigmatism correction coil driver 44 are operated accordingly to produce correction values tailored to suit each sub-field.

Figure 20:
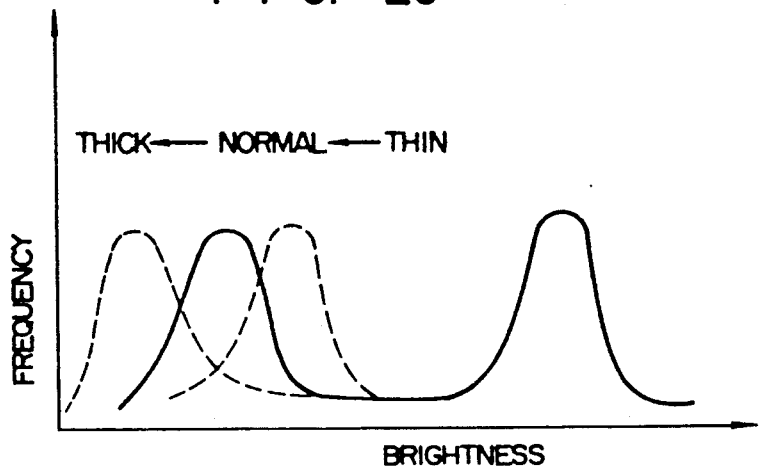
FIG. 20 is a diagram showing the principle of pattern thickness detection which is applied to the inspection apparatus of FIG. 7.
Figure 21:
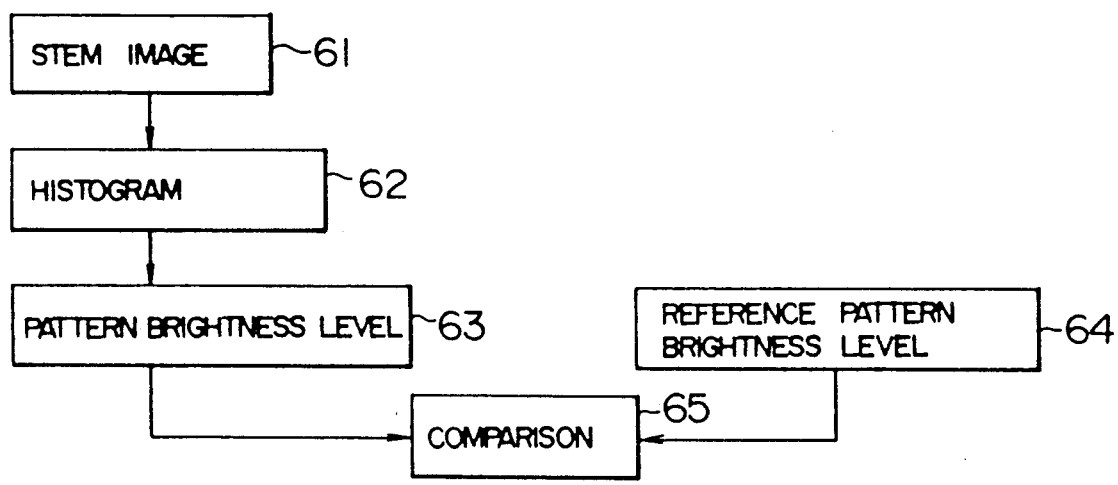
FIG. 21 is a block diagram showing the method of inspecting the pattern thickness utilizing the method of FIG. 20.

FIG. 21 shows in block diagram a method of detecting the variation of pattern thickness across a wide range. Step 62 makes a histogram of the STEM image detected in step 61, as shown in FIG. 20, and step 63 evaluates the brightness level of the pattern. Step 65 compares the level obtained in step 63 with the reference brightness level which has been set in step 64 thereby to inspect the pattern thickness.

Figure 22:
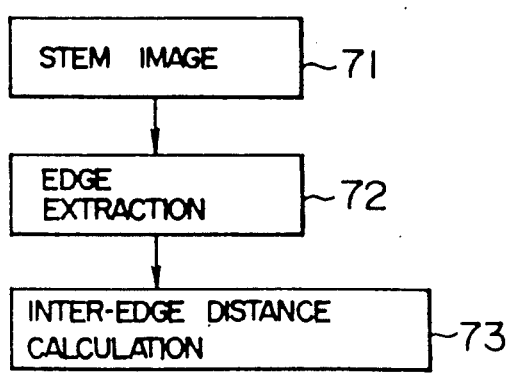
FIG. 22 is a block diagram showing the method of measuring the pattern dimensions applied to the inspection apparatus of FIG. 7.

FIG. 22 shows in block diagram a method of measuring the pattern dimensions by application of the inventive pattern detection apparatus. Step 72 detects the edge position of a pattern to be measured from the STEM image which has been detected in step 71. There are two methods for the edge extraction. One is to display a STEM image on the CRT screen and define the edge visually using the cursor, and the other is to determine the edge on the basis of the slope of the waveform. After both edges of a pattern to be measured have been determined, step 73 calculates the distance between the two edges, and the length measuring function is accomplished.

Figure 23:
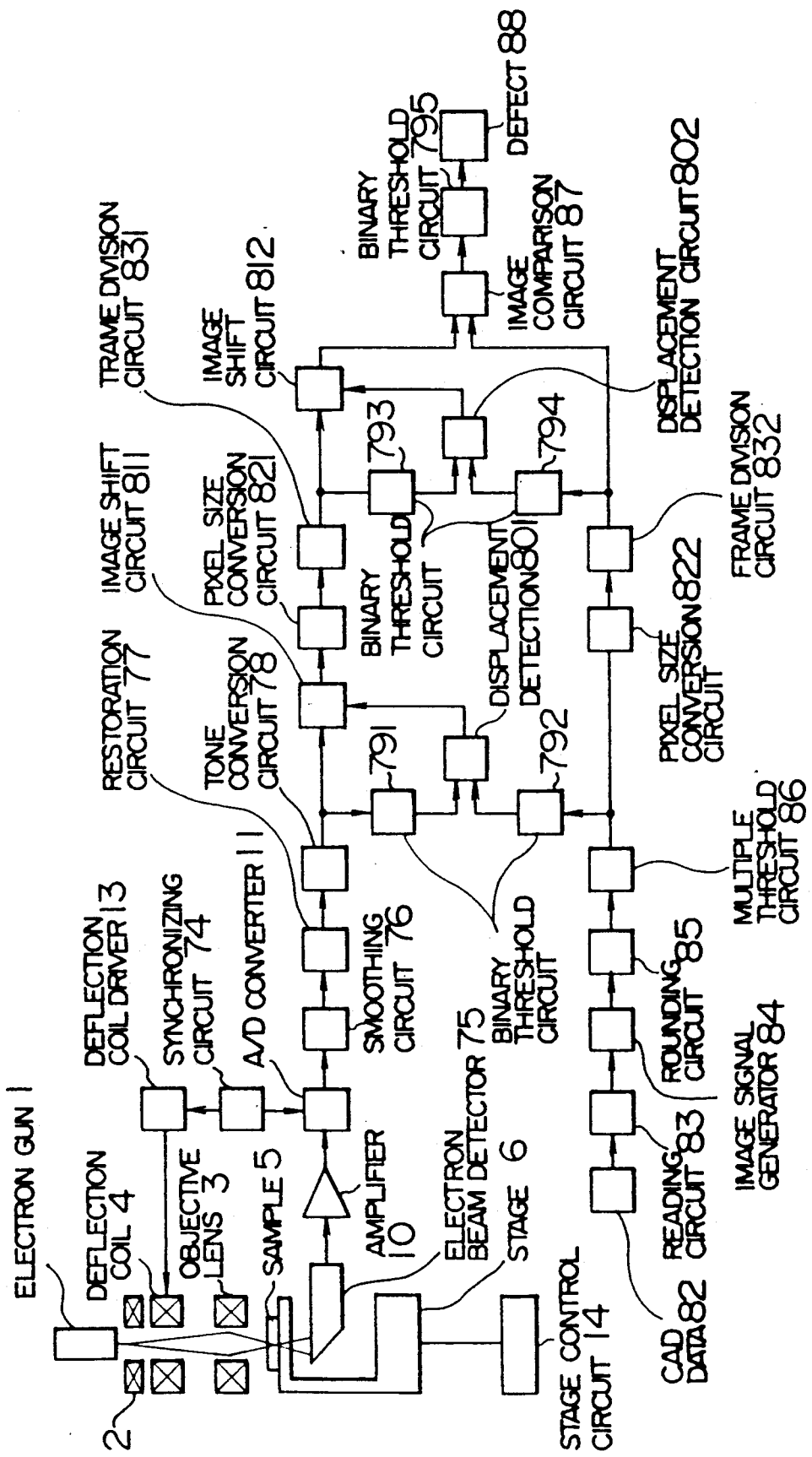
FIG. 23 is a block diagram showing another embodiment of the inventive pattern inspection apparatus.

FIG. 23 is a block diagram showing another embodiment of the pattern defect inspection apparatus using the inventive scanning electron microscope.

Shown in FIG. 23 is an X-ray mask pattern defect inspection apparatus using the scanning transmission electron microscope of FIG. 7, and identical components in these figures are referred to by the common symbols. Indicated by 74 is a synchronizing circuit, 75 is an electron beam detector, 76 is a smoothing circuit, 77 is a restoration circuit, 78 is a tone level conversion circuit, 791, 792, 793, 794 and 795 are binary threshold circuits, 801 and 802 are position deviation detecting circuits also known as displacement detection circuits, 811 and 812 are image shift circuits, 82 is a memory (of CAD data), 821 and 822 are pixel size conversion circuits 83 is a reading circuit, 831 and 832 are frame division circuits, 84 is an image signal generator, 85 is a corner rounding circuit, 86 is a multiple threshold circuit, 87 is an image comparison circuit, and 88 is a memory (of defects). These components are connected as shown in the figure. The pattern defect inspection apparatus of this embodiment operates to compare an electron microscopic image of the X-ray mask pattern which is a sample 5 detected by the scanning transmission electron microscope shown in FIG. 7 with the ideal pattern produced from CAD data which is image data of the X-ray mask stored in the memory 82, and display inconsistent portions as defects. In FIG. 23, components including an electron gun 1, deflection coil 4, objective lens 3, electron beam detector 75, amplifier 10, deflection coil driver 13, synchronizing circuit 74, and A/D converter 11 are constituent elements of the usual scanning transmission electron microscope as have been explained on FIG. 7. Since the scanning transmission electron microscope has a view field which is narrower than the inspection area of the sample X-ray mask 5, the sample is placed on the stage 6 and the front face of the inspection area is inspected in step-and-repeat operation by a stage control circuit 14.

The electron microscopic image provided by the restoration circuit 77 of the scanning transmission electron microscope is entered to the tone level conversion circuit 78 and the tone level is converted so that the average brightness of the pattern section and membrane section is equal to the reference value. For an average concentration value p and reference value p′ of the pattern section of the image, an average concentration m and reference value m′ of the membrane section, and a concentration value z of the original image, the converted concentration value z′ of the image is evaluated by the following equation.

$$z' = \frac{m' - p'}{m - p}(z - p) + p' \tag{5}$$

The average concentration values p and m of the pattern section and membrane section are readily evaluated from the histogram of the detected image. The CAD data for drawing the pattern stored in the memory 82 is read out by the reading circuit 83, and a reference image (ideal image) of the mask pattern corresponding to the detection position of the sample 5 of the scanning transmission electron microscope is produced by the image signal generator 84. An actual mask pattern of the sample 5 has its corner rounded, and therefore the reference image produced by the image signal generator 84 is entered to the corner rounding circuit 85 for rounding so that a round corner of the mask pattern is not detected as a defect. For the comparison process for the detected image, a binary image is converted into a tone image by the multiple threshold circuit 86. This conversion process is conducted favorably by using a smoothing filter having a Gauss distribution for the point spread function PSF. In this case, for an input image of f(x, y), output image of g(x, y) and PSF of h(x, y), the conversion equation is given as follows.

$$g(x, y) = \int\int h(x-x', y-y') \cdot f(x', y') dx' dy' \tag{6}$$

where $$h(x, y) = \frac{1}{\pi\sigma^2} \exp\left(-\frac{x^2 + y^2}{\sigma^2}\right),$$

and $\sigma^2$ is the variance. In order to convert the reference image (binary image) into a tone image having a smooth variation of concentration, it is preferable to convert the reference image at a pixel size smaller than the detected pixel size and thereafter sample pixels thereby to make them equal to the detected pixel size.

Next, the detected image provided by the tone conversion circuit 78 and the reference image provided by the multiple threshold circuit 86 are reformed into binary images by the binary threshold circuits 791 and 792, respectively, the positional deviation of the two images is calculated by the position deviation detection circuit 801, and the detected image is positioned by the image shift circuit 811. In order to detect much smaller defects, the pixel size is halved (e.g., from 0.05 μm/pix to 0.025 μm/pix) by the pixel size conversion circuits 821 and 822. This conversion process divides a pixel into four pixels, and the processing equations are as follows.

$$\begin{aligned}a &= (9A + 3B + 3C + D)/16 \\ b &= (9B + 3A + 3D + C)/16 \\ c &= (9C + 3D + 3A + B)/16 \\ b &= (9D + 3C + 3B + A)/16\end{aligned} \tag{7}$$

where A, B, C, and D are brightness of pixels before conversion, and a, b, c and d are brightnesses of pixels after conversion. Because of the presence of image distortion included in a detected image of the scanning transmission electron microscope, positioning is conducted once again. If there is a pixel distortion, positioning for the entire frame merely results in an average positioning for the whole. Since each section of a frame can further be positioned individually, a frame is divided and each divisional frame is rendered positioning through a further binary reformation. The frame dividing circuits 831 and 832 implement frame division for the detected image and reference image, the binary threshold circuits 793 and 794 reform the images into binary, and the positioning deviation circuit 802 evaluates the position deviation of frames of the two images and the image shift circuit 812 positions the frame of the detected image.

The image comparison circuit 87 performs tone image comparison for the detected image and reference image which have been positioned as described above, and the binary threshold circuit 795 reforms the differential image into binary, and coordinates of inconsistent portions are stored as defects in the memory 88. The algorithm of tone image comparison by the image comparison circuit 87 is preferably the local perturbation pattern matching method. The local perturbation pattern matching method is an algorism which makes matching for the detected image to the reference image for each local region on the xy plane in the direction of brightness, and extracts unmatched portions as defects. The resulting tone image D(x, y) is given in terms of the differential image $S_k(x, y)$, detected image I(x, y) and reference image R(x, y) as follows.

$$D(x, y) = \begin{cases} 0, \text{ if } \max\left\{ \sum_{m=-1}^{1} \sum_{n=-1}^{1} S_k(x+m, y+n) \right\} \\ x\min\left\{ \sum_{m=-1}^{1} \sum_{n=-1}^{1} S_k(x+m, y+n) \right\} \leq 0 \\ x\min\left\{ \left| \sum_{m=-1}^{1} \sum_{n=-1}^{1} S_k(x+m, y+n) \right| \right\}, \text{ else} \end{cases} \quad (8)$$

where, $S_1 \sim S_4(x, y) = I(x, y) - R(x+i, y+j)$, $(i, j) = (-1, 0), (1, 0), (0, -1), (0, 1)$ $S_5 \sim S_8(x, y) = I(x, y) = I(x, y) - \{(\sqrt{2} - 1)R(x, y) +$ $R(x - i, y + j)\}/\sqrt{2}$, $(i, j) = (-1, -1), (-1, 1), (1, -1), (1, 1)$ $S_9 \sim S_{10}(x, y) - R(x, y) \pm a$ The STEM image is flowing along the scanning direction mainly due to the delay of the scintillator 7 and photoelectron multiplying tube 9 that are the constituent elements of the electron beam detector 75 (but not shown individually in FIG. 23). The following describes the procedure of restoring the flow (dull of signal waveform) of the electron image. Initially, the signal which has been quantized by the A/D converter 11 is rendered noise reduction by the smoothing circuit 76, and the output signal of the smoothing circuit 76 is entered to the restoration circuit 77 thereby to restore the deterioration of the signal waveform.

Figure 24:
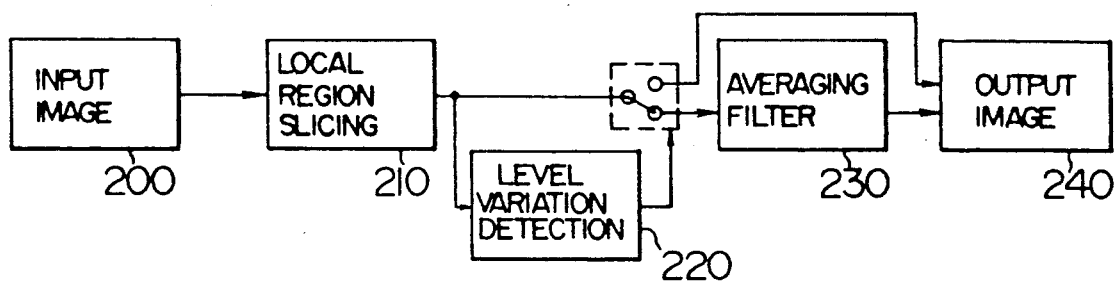
FIG. 24 is a block diagram showing the operational procedure of the smoothing circuit shown in FIG. 23.

FIG. 24 is a functional block diagram which represents the operational procedure of the smoothing circuit 76 shown in FIG. 23. In FIG. 24, indicated by 200 is an input image, 210 is a local region slice circuit, 220 is a level variation detecting circuit, 230 is an averaging filter, and 240 is an output image. In FIG. 24, the output signal of the A/D converter 11, as the input image 200, is fed to the local region slice circuit 210, which slices a local region of 3-by-3 pixels from the input image 200. The signal level variation within the local region is detected by the level variation detector 220, which then calculates a difference between the brightest concentration value and darkest concentration value within the local region. If the concentration difference is smaller than a certain predetermined value, the signal levels within the local region are smoothed by the averaging filter 230, and if the concentration difference is larger than a certain predetermined value, the concentration (signal level) of the input image 200 is outputted directly, and output image 240 which is smoothed in a nonlinear fashion is obtained. The averaging filter 230 may be another filter, e.g., center value filter, provided that it has a smoothing ability.

The process of the smoothing circuit 76 is summarized as follows.

$A = \max\{in(i-1, j-1), in(i-1, j), in(i-1, j+1),$
$\quad in(i, j-1), in(i, j), in(i, j+1),$
$\quad in(i+1, j-1), in(i+1, j), in(i+1, j+1)\}$ $B = \min\{in(i-1, j-1), in(i-1, j), in(i-1, j+1),$
$\quad in(i, j-1), in(i, j), in(i, j+1),$
$\quad in(i+1, j-1), in(i+1, j), in(i+1, j+1)\}$ if $(A - B \leq N)$ then $$out(i, j) = \frac{1}{9} \sum_{k=-1}^{1} \sum_{l=-1}^{1} in(i+k, j+l)$$

else $C = \max\{in(i-1, j), in(i, j), in(i+1, j)\} -$
$\quad \min\{in(i-1, j), in(i, j), in(i+1, j)\}$ $D = \max\{in(i, j-1), in(i, j), in(i, j+1)\} -$
$\quad \min\{in(i, j-1), in(i, j), in(i, j+1)\}$ if $(C \leq D. \text{ AND. } C \leq N)$ then $$out(i, j) = \frac{1}{3} \sum_{k=-1}^{1} in(i+k, j)$$

else if $(C > D. \text{ AND. } D \leq N)$ then $$out(i, j) = \frac{1}{3} \sum_{k=-1}^{1} in(i, j+k)$$

else $out(i, j) = in(i, j)$ end if end if where in (i, j) is the input image, out(i, j) is the output image, and N is a constant (e.g., N=8).

Figure 25:
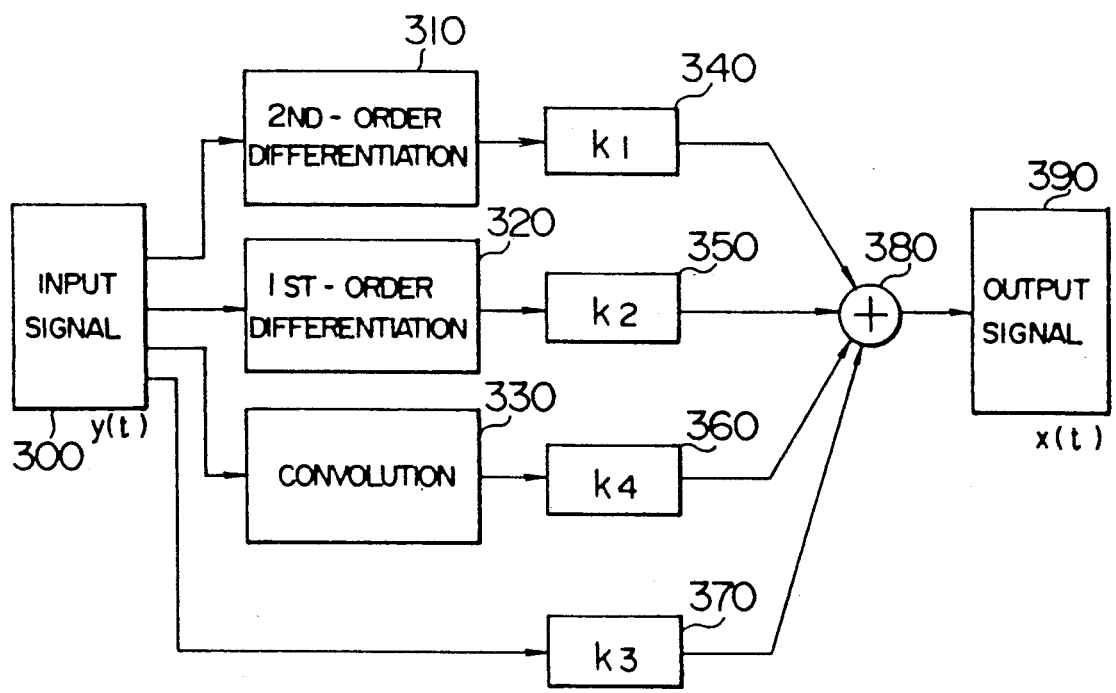
FIG. 25 is a block diagram showing the operational procedure of the restoration circuit shown in FIG. 23.

FIG. 25 is a functional block diagram which presents the operational procedure of the restoration circuit 77 shown in FIG. 23. In FIG. 25, indicated by 300 is an input signal, 310 is a second-order differentiation circuit, 320 is a first-order differentiation circuit, 330 is a convolution circuit, 340, 350, 360 and 370 are multipliers, 380 is an adder, and 390 is an output signal. The output signal of the smoothing circuit 76 shown in FIG. 23 is entered as the input signal 300 to the restoration circuit 77 of FIG. 25, the quadratic differential of the input signal 300 is calculated by the quadratic differentiation circuit 310, the primary differential of the input signal 300 is calculated by the first-order differentiation circuit 320, the convolution of the input signal 300 is calculated by the convolution circuit 330, the quadratic differential is multiplied by $k_1$ by the multiplier 340, the primary differential is multiplied by $k_2$ by the multiplier 350, the convolution is multiplied by $k_4$ by the multiplier 360, the input signal 300 is multiplied by $k_3$ by the multiplier 370, and these four signals are summed by the adder 380 to obtain the output signal 390 as follows.

The restoration of deterioration of the detected waveform by the restoration circuit 77 uses the inverse function of the transfer function of the electron beam detector. It was confirmed by experimentation that when the scintillator (same as 7 of FIG. 7) of FIG. 23 uses mono-crystal of YAP and the photoelectron multiplying tube (same as 9 of FIG. 7) uses the head-on type (model R269 manufactured by Hamamatsu Photonics), the transfer function G(s) of the electron beam detecting system is given by the following formula.

$$G(s) = \frac{1}{\tau_p s + 1} \left( \frac{1 - A_1 - A_2}{\tau_1 s + 1} + \frac{A_1}{\tau_2 s + 1} + \frac{A_2}{\tau_3 s + 1} \right) \quad (9)$$

where $A_1 = 0.29$, $A_2 = 0.24$, $\tau_1 = 0.02$ μs, $\tau_2 = 0.07$ μs, $\tau_3 = 1.5$ μs, and $\tau_p = 1.5$ μs. Accordingly, the transfer function of restoration, i.e., the inverse function $H(s) = 1/G(s)$ of the transfer function $G(s)$ of electron beam detecting system (signal transmission system) is obtained as follows.

$$H(s) = \frac{1}{G(s)} \quad (10)$$
$$= \frac{(\tau_p s + 1)(\tau_1 s + 1)(\tau_2 s + 1)(\tau_3 s + 1)}{I(s)}$$

where $$I(s) = \{A_2 \tau_1 \tau_2 + (1 - A_1 - A_2)\tau_2 \tau_3 + A_1 \tau_3 \tau_1\} s^2 +$$
$$\{(A_1 + A_2)\tau_1 + (1 - A_1)\tau_2 + (1 - A_2)\tau_3\} s + 1$$

Substituting numeric values to the formula results as follows.

$$H(s) = 0.00540 s^2 + 0.275 s + 0.665 - \frac{0.223}{s + 0.8870} + \frac{11.6}{s + 19.7} \quad (11)$$

For the Laplace transformation Y(s) of signal y(t) of the deteriorated image of the input signal 300, and the Laplace transformation X(s) of signal x(t) of the restored image of the output signal 390, the following equation is established.

$$X(s) = H(s) \cdot Y(s) \quad (12)$$

Substituting the equation (11) into the equation (12), and taking inverse Laplace transformation results as follows.

$$x(t) = k_1 y''(t) + k_2 y'(t) + k_3 y(t) + \int_0^t h(t - \tau) y(\tau) d\tau \quad (13)$$

where $k_1 = 0.00540$, $k_2 = 0.275$ and $k_3 = 0.665$ $$h(t) = -0.223 e^{-0.870 t} + 11.6 e^{-19.6 t} \quad (13')$$

Equation (13) is the desired restoration equation. Reforming differentiation to difference and integration to product-sum in the equation (13) for reducing the equation to the discrete type results as follows.

$$x(t) = k_1 \frac{y(t + \Delta t) - 2y(t) + y(t - \Delta t)}{\Delta t^2} + \quad (14)$$

$$k_2 \frac{y(t + \Delta t) - y(t - \Delta t)}{2 \cdot \Delta t} + k_3 y(t) +$$

$$\sum_{i=0}^{n} h(t - i \cdot \Delta t) y(i \cdot \Delta t) \cdot \Delta t$$

where $\Delta t$ is the sampling interval of the signal, and $n = t/\Delta t$. The sampling frequency is set to 15 MHz, i.e., the sampling interval $\Delta t$ is set to 0.067 μs.

Figure 26:
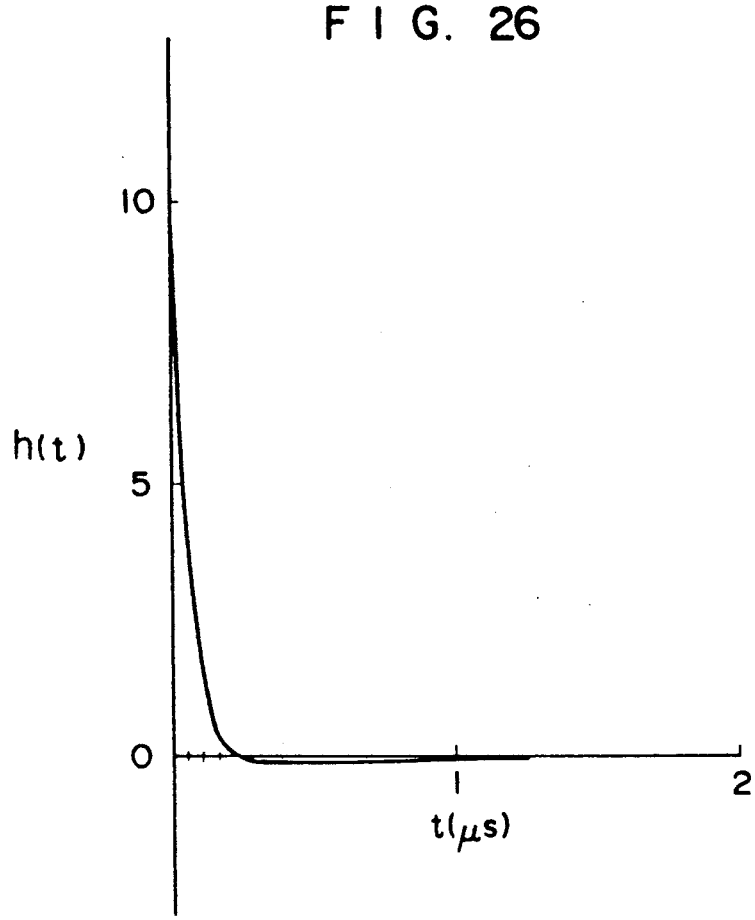
FIG. 26 is a graph of the function h(t) of restoration equation used in the restoration circuit shown in FIG. 25.

FIG. 26 is a graph of the function h(t) of the equation (13') in the restoration equation (13) of the restoration circuit 77 shown in FIG. 23, in which h(t) is plotted on the vertical axis against time t (μs) on the horizontal axis. The function h(t) approaches zero as the value of t increases, and therefore the h(t) can be approximated to zero for t above a certain value. Accordingly, the convolution of the fourth term of the restoration equation (13) can have a limited period of integration. Accordingly, the equation (14) can further be reformed as follows.

$$x(t) = k_1 \frac{y(t + \Delta t) - 2y(t) + y(t - 1)}{\Delta t^2} + \quad (15)$$

$$k_2 \frac{y(t + \Delta t) - y(t - \Delta t)}{2 \cdot \Delta t} + k_3 y(t) +$$

$$\sum_{i=0}^{m} h(i \cdot \Delta t) y(t - i \cdot \Delta t) \cdot \frac{1 - k_3}{\sum_{i=0}^{m} h(i \cdot \Delta t)}$$

The equation can further be simplified by neglecting the term of convolution as follows.

$$x(t) = k_1 \frac{y(t + \Delta t) - 2y(t) + y(t - 1)}{\Delta t^2} + \quad (16)$$

$$k_2 \frac{y(t + \Delta t) - y(t - \Delta t)}{2 \cdot \Delta t} + k_3 y(t)$$

By using the above restoration equations (15) and (16), the deteriorated waveform can be restored to the restoration waveform x(t).

By the above restoration equation (15), the restoration circuit 77 in FIG. 25 operates to receive the output signal y(t) of the smoothing circuit 76 as the input signal 300. Then the circuit 77 will calculate the quadratic differential of the signal y(t) based on the first term of the equation (15) using the second-order differentiation circuit 310, calculate the primary differential of the signal y(t) based on the second term of the equation (15) using the first-order differentiation circuit 320, calculate the convolution of the signal y(t) as the third term of the equation (15):

$$\sum_{i=0}^{m} h(i \cdot \Delta t) y(t - i \cdot \Delta t)$$

using the convolution circuit 330, multiply the output of the second-order differentiation circuit 310 by $k_1$ using the multiplier 340, multiply the output of the first-order differentiation circuit 320 by $k_2$ using the multiplier 350, multiply the output of the convolution circuit 330 by $$k_4 = (1 - k_3) / \sum_{i=0}^{m} h(i \cdot \Delta t),$$

multiply the signal y(t) by $k_3$ using the multiplier 370, and sum these four signals using the adder 380 to obtain the restored signal x(t) of the equation (15) as the output signal 390.

Figure 27:
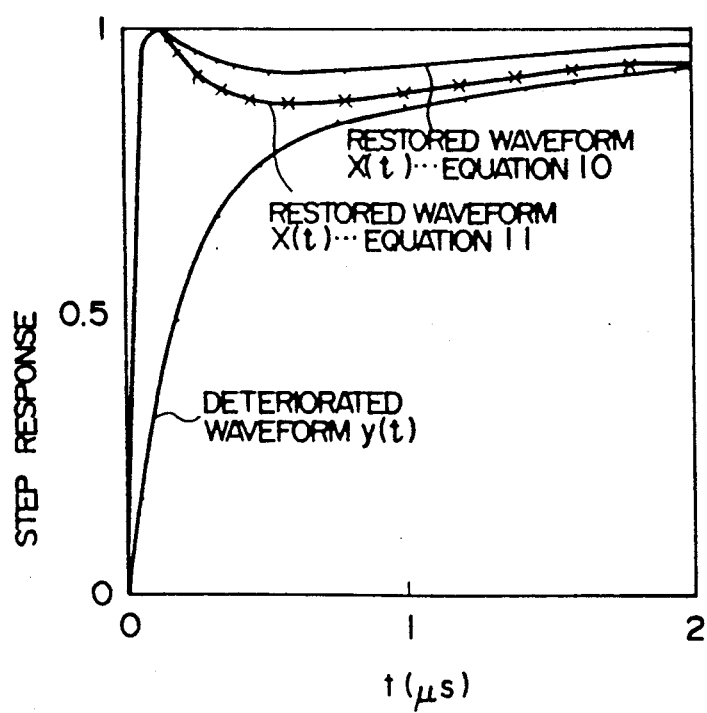
FIG. 27 is a graph showing the deteriorated input waveform y(t) and the restored output waveform x(t) for the step response according to the restoration circuit of FIG. 25.

FIG. 27 is a graph showing the deteriorated waveform y(t) of the input signal 300 and the restored waveform x(t) of the output signal 390 for a step response of the restoration circuit 77 shown in FIG. 25. In FIG. 27, the deteriorated waveform y(t) is fairly restored in the restored waveform x(t) on the basis of the restoration equations (15) and (16). The signal x(t) restored by the restoration circuit 77 is subjected to D/A conversion by the display circuit and it is displayed on a Braun tube.

Figure 28:
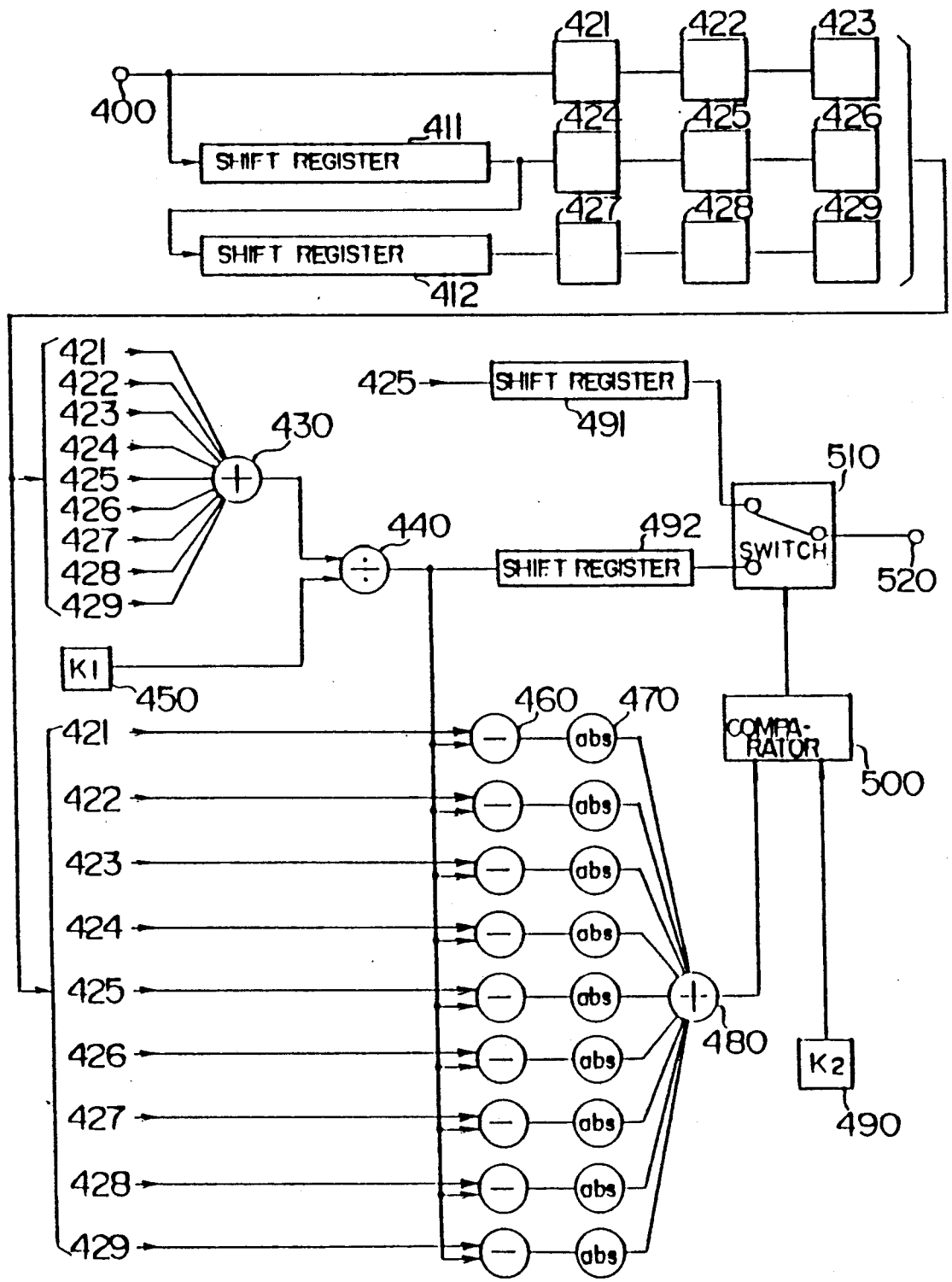
FIG. 28 is a block diagram showing an example of the smoothing circuit shown in FIG. 23 (FIG. 24)

FIG. 28 shows an example of the smoothing circuit 76 shown in FIG. 23 (FIG. 24). In FIG. 28, 400 represents an input terminal, 411 and 412 are shift registers, 421-429 are registers, 430 is an adder, 440 is a divider, 450 is a subtracter 470 is an absolute value calculator, 480 is an adder, 490 is a memory, 500 is a comparator, 510 is a switch, and 520 is an output terminal. These components are connected as shown in the figure. From the input signal received from the A/D converter 11 on the input terminal 400 of FIG. 28, a local region of 3-by-3 pixels is sliced using the shift registers 411, 412, 429 and 429. For evaluating the mean value of signals $y_i$ of the 3-by-3 pixels, the outputs of the registers 421-429 are summed by the adder 430, and it is divided by a constant $k_1 = 9$ stored in the memory 450 using the divider 440.

Although in the explanation of FIG. 24 the signal level variation is estimated as a difference between the maximum value and minimum value within a local region, here, it is estimated as a variance $\sigma'$ as follows.

$$\sigma' = \sum_{i=1}^{9} |y_i - \bar{y}| \quad (17)$$

$$\bar{y} = \frac{1}{9} \sum_{i=1}^{9} \bar{y}_i$$

Figure 29:
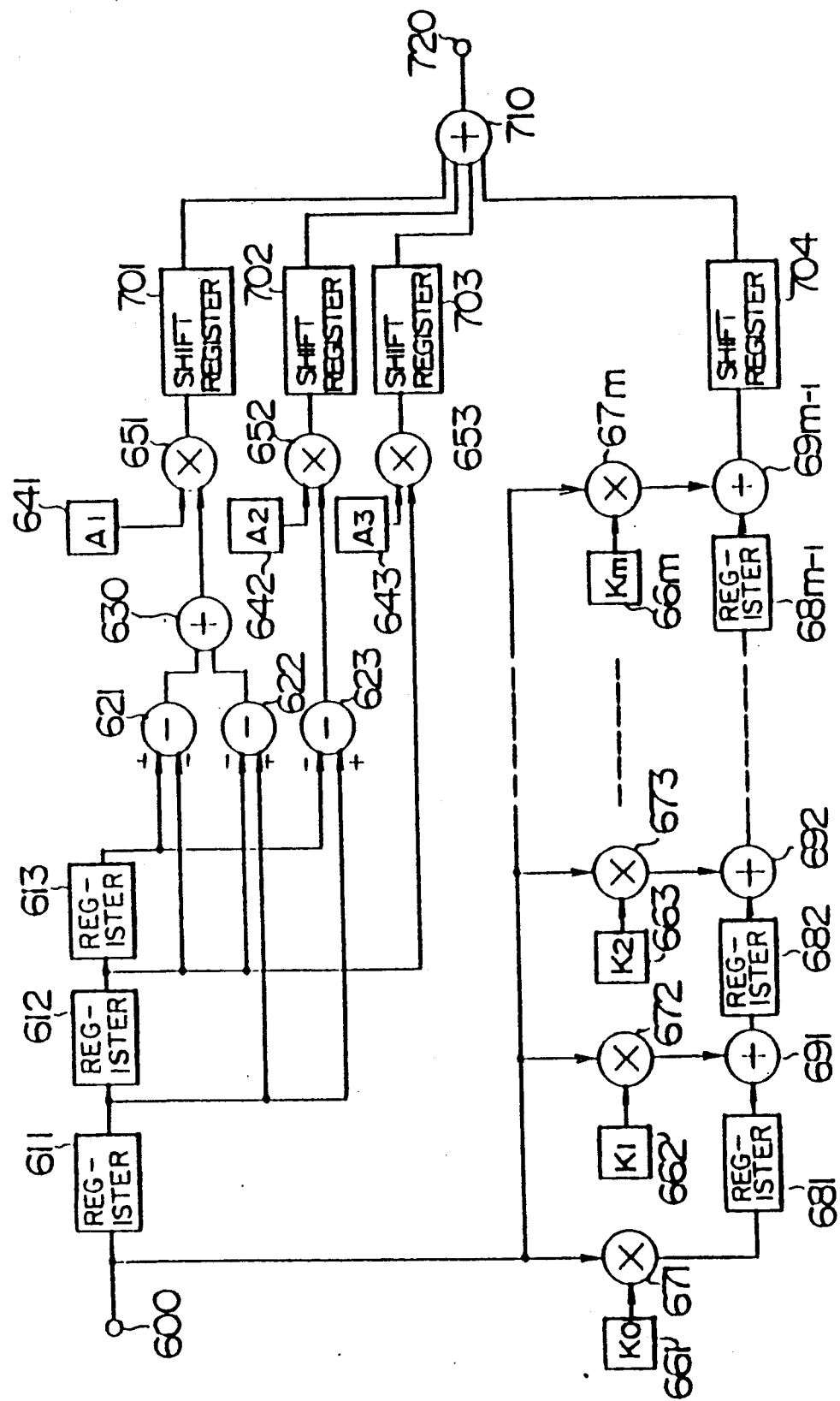
FIG. 29 is a block diagram showing an example of the restoration circuit shown in FIG. 23 (FIG. 25)

From the outputs of the registers 421-429 and the output $\bar{y}$ of the divider 440, the variance $\sigma'$ of equation (17) is calculated using the subtracter 460, absolute value calculator 470 and adder 480. The variance $\sigma'$ is compared with a predetermined constant $K_2$ stored in the memory 490 using the comparator 500. In response to a comparison result of $\sigma' > K_2$, the switch 510 is set so that the contents of the register 425 are delivered directly to the output terminal 520 through a shift register 491, and in response to a comparison result of $\sigma' \leq K_2$, the mean value $\bar{y}$ of the local region from the divider 440 is delivered to the output terminal 520 through the switch 510 through a shift register 491. The shift registers 491 and 492 are used for timing the output of the comparator 500 with the output of the register 425 or the output of the divider 440. By the operation of the above circuit arrangement, a nonlinear smoothing process can be implemented on a real time basis. FIG. 29 shows an example of the restoration circuit 77 shown in FIG. 23 (FIG. 25). In FIG. 29, 600 represents an input terminal, 611-613 are registers, 621-623 are subtracters 630 is an adder, 641-643 are memories, 651-653 are multipliers, 661-66m are memories, 671-67m are multipliers, 681-68m−1 are registers, 691-69m−1 are adders, 701-704 are shift registers, 710 is an adder, and 720 is an output terminal. These components are connected as shown in the figure. The restoration circuit 77 of FIG. 29 reforms a waveform for the above restoration equation (15) in terms of a signal string as follows.

$$x(i) = A_1(y(i+1) - 2y(i) + y(i-1)) + A_2(y(i+1) - \quad (18)$$

$$y(i-1)) + A_3y(i) + \sum_{j=0}^{m} K_{m-i} \cdot y(i-j)$$

where $A_1 = k_1/\Delta t^2$, $A_2 = k_2/2 \cdot \Delta t$, $A_3 = k_3$, $$K = \frac{1 - k_3}{\sum_{i=0}^{m} h(i \cdot \Delta t)} \cdot h((m-j)\Delta t)$$

The circuit performs the restoring process based on the restoration equation (18). The restoration circuit 77 receives on its input terminal 600 the signal y(i) from the smoothing circuit 12, and stores the signals y(i+1), y(i) and y(i−1) in the registers 611-613. The subtracters 621 and 622 and adder 630 operate to calculate the first term y(i+1)−2y(i)+y(i−1) of the equation (18) and the multiplier 651 multiplies it with a constant $A_1$ stored in the memory 641, and the first term $A_1(y(i+1)-2y(i)+y(i-1))$ is obtained. Similarly, the subtracter 623 and multiplier 652 calculate the second term $A_2(y(i+1)-y(i-1))$ for a constant $A_2$ stored in the memory 642, and the multiplier 653 calculates the third term $A_3y(i)$ for a constant $A_3$ stored in the memory 643. The circuit for calculating the fourth term of convolution $$\sum_{j=0}^{m} K_{m-j} \cdot y(i-j)$$

of the input signal y(i) comprises memories 661-66m, multipliers 671-67m, registers 681-68m−1 and adders 691-69m−1. The outputs of the multipliers 651-653 and adder 69m−1 are timed by the shift registers 701-704 and summed by the adder 710, and the restored signal x(i) of the restoration equation (18) is produced on the output terminal 720.

Figure 30:
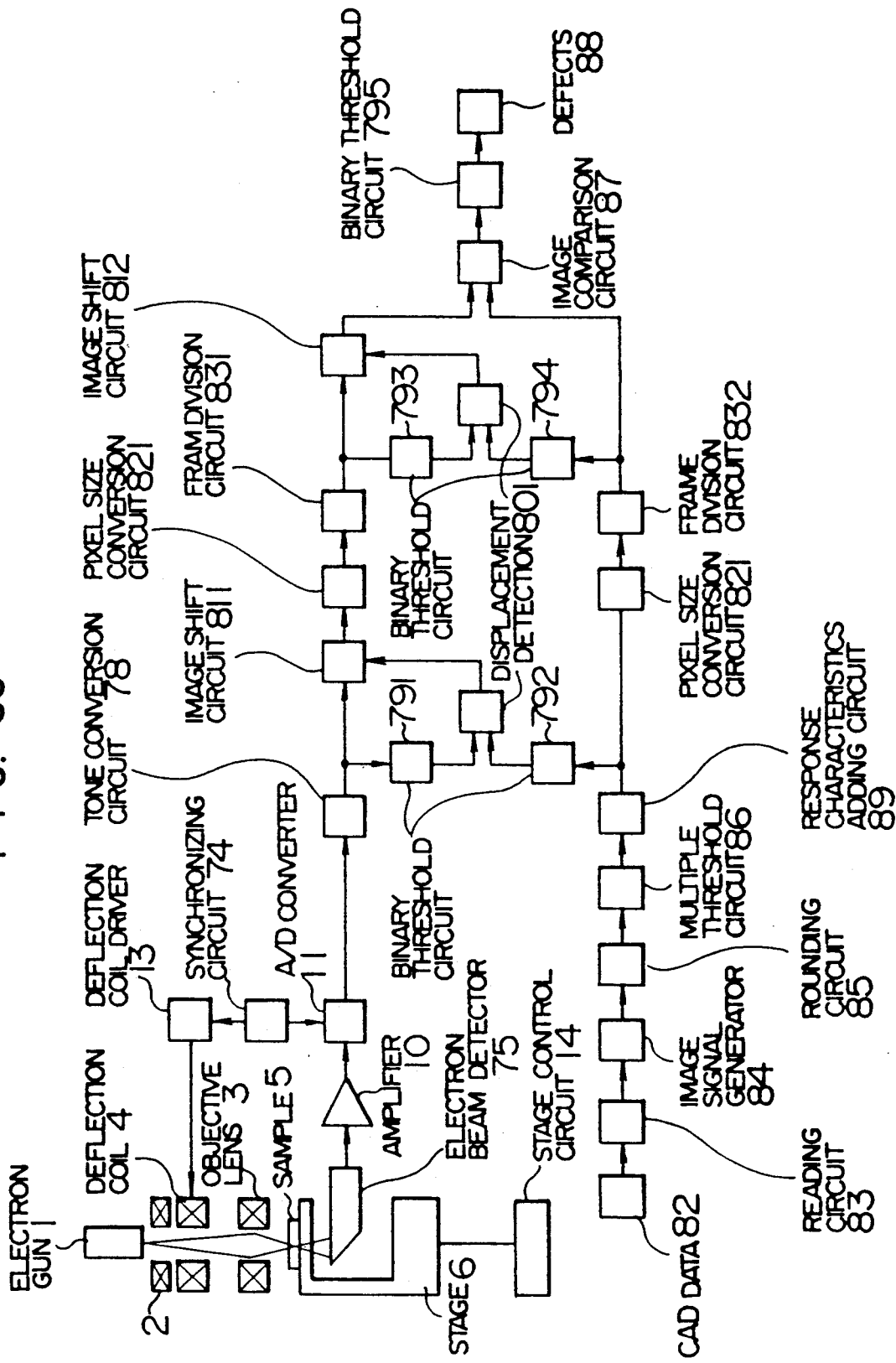
FIG. 30 is a block diagram showing a further embodiment of the inventive pattern inspection apparatus.

FIG. 30 is a block diagram showing a further embodiment of the pattern inspection apparatus using the inventive scanning transmission electron microscope. Shown in FIG. 30 is a further embodiment of the X-ray mask pattern inspection apparatus using the scanning transmission electron microscope of FIG. 7. Portions equivalent to those in FIG. 23 are referred to by the common symbols. Indicated by 89 is a response characteristics adding circuit. The pattern inspection apparatus of this embodiment differs from the embodiment of FIG. 23 in that the apparatus of FIG. 23 performs restoration of a detected image of the scanning transmission electron microscope using the smoothing circuit 76 and restoration circuit 77, whereas the apparatus of FIG. 30 does not restore a detected image of the scanning transmission electron microscope, but the response characteristics adding circuit 89 appends the response characteristics of the electron beam detection system of the scanning transmission electron microscope to a reference image (ideal image) generated from CAD data stored in the memory 82. The response characteristics adding circuit 89 dulls the waveform of the reference image in accordance with the transfer function G(s) of response characteristics of the electron beam detection system including the electron beam detector 75, amplifier 10 and A/D converter 11.

-continued $$G(s) = \frac{1}{\tau_p s + 1}\left(\frac{1 - A_1 - A_2}{\tau_1 s + 1} + \frac{A_1}{\tau_2 s + 1} + \frac{A_2}{\tau_3 s + 1}\right)$$

The inverse Laplace transformation of this transfer function G(s), i.e., the impulse response g(t) is given as follows.

$$g(t) = \frac{1}{\tau_p}\left(1 + \frac{(1 - A_1 - A_2)\tau_1}{\tau_p - \tau_1} + \right.$$

$$\left. \frac{A_1\tau_2}{\tau_p - \tau_2} + \frac{A_2\tau_3}{\tau_p - \tau_3}\right)e^{-\frac{t}{\tau_p}} - \frac{1 - A_1 - A_2}{\tau_p - \tau_1}e^{-\frac{t}{\tau_1}} -$$

$$\frac{A_1}{\tau_p - \tau_2}e^{-\frac{t}{\tau_2}} - \frac{A_2}{\tau_p - \tau_3}e^{-\frac{t}{\tau_3}} \quad (19)$$

The output signal y(t) is expressed as convolution in terms of the input signal x(t) and impulse response g(t) as follows.

$$y(t) = \int_0^t g(\tau)x(t - \tau)d\tau \quad (20)$$

This is reduced to a discrete form as follows.

$$y(t) = \sum_{i=0}^{n} g(i \cdot \Delta t) \cdot x(t - i \cdot \Delta t) \cdot \Delta t \quad (21)$$

where Δt is the sampling interval of the signal. Accordingly, the response characteristics adding circuit 89 is designed to implement the equation (21), and it can be, for example, a digital signal processor DSP which calculates the convolution sum, or the circuit shown in FIG. 31. The rest is the same as FIG. 23.

Figure 31:
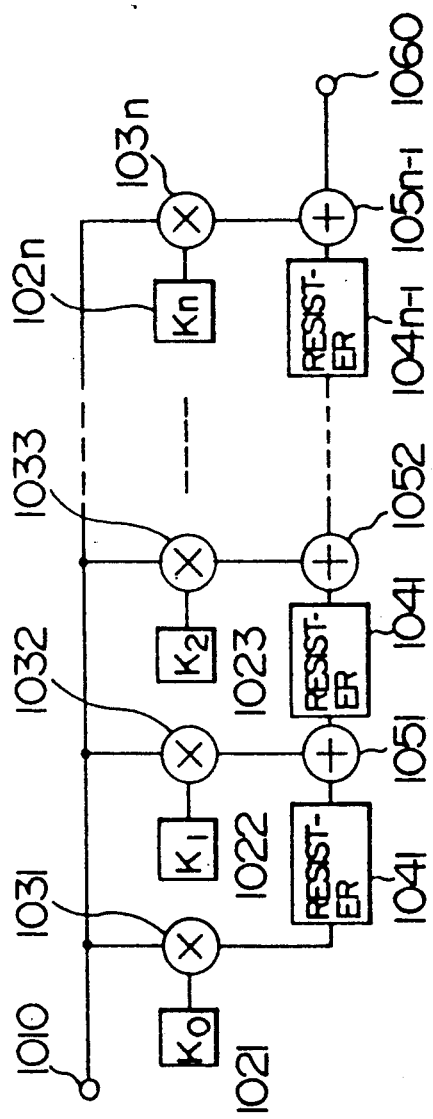
FIG. 31 is a block diagram showing the circuit for calculating the convolution sum in the response characteristic adding circuit of FIG. 30.

FIG. 31 shows the circuit for calculating the convolution sum of the response characteristics adding circuit 89 in FIG. 30. In FIG. 31, indicated by 1010 is an input terminal, 1021-102$_n$ are memories, 1031-103$_n$ are multipliers, 1041-104$_{n-1}$ are registers, 1051-105$_{n-1}$ are adders, and 1060 is an output terminal. The signal x(t) received on the input terminal 1010 of FIG. 31 is multiplied by factors $K_i = \Delta t \cdot g(i \cdot \Delta t)$ (where i=0 to n) stored in the memories 1021-102$_n$ by the multipliers 1031-103$_n$, and the multiplied results are summed by the adders 1051-105$_{n-1}$ while being delayed by the registers 1041-104$_{n-1}$, and the signal y(t) which is the convolution sum based on the equation (21) is produced on the output terminal 1060.

We claim:

1. A method for detecting the pattern of a sample by an electron image signal y(t) detected by an image detection system of a scanning electron microscope the method comprising the steps of:
    scanning an electron beam on the sample;
    obtaining a restoration waveform image signal x(t) by processing said electron image signal y(t) obtained by reflected electrons, secondary electrons, or transmitted electrons from the sample in accordance with an equation h(t) resulting from an inverse Laplace transformation for an inverse function H(s) of a transfer function G(s), which approximates the response delay characteristics of said image detection system so as to recovery the deterioration of the detected electron image signal y(t) provided by the image detection system; and,
    recognizing the pattern of the sample by the restoration waveform image signal x(t).

2. The method according to claim 1 further including the step of converting the electron image to a light image, with a scintillator of the image detection system.

3. The method according to claim 2 wherein said image detection system is further including the step of concerting a light image to an electrical image with a photoelectron multiplying tube of the image detection system.

4. A scanning electron microscope with a sharply converged electron beam operating to scan a sample and detect reflected electrons, secondary electrons or transmitted electrons by an image detection system to provide an electron image signal y(t), wherein said microscope comprises:
    restoration means for obtaining a restoration waveform image signal x(t) by recovering a deterioration of said electron image signal y(t) caused by response delay characteristics of said image detection system in accordance with an equation h(t) process resulting from an inverse Laplace transformation for an inverse function H(s) of a transfer function G(s) which approximates the response delay characteristics of said image detection system so as to recover the deterioration of the detected image signal y(t) provided by the image detection system; and,
    means for recognizing the pattern of the sample by the restoration waveform image signal x(t).

5. The scanning electron microscope according to claim 4, wherein said image detection system provides a scintillator which converts the electron image to a light image.

6. The scanning electron microscope according to claim 5 wherein said image detection system is further provided with a photoelectron multiplying tube which converts a light image to an electrical image.

7. A scanning electron microscope with a sharply converged electron beam operating to a scan sample and detect reflected electrons, secondary electrons or transmitted electrons by an image detection system to provide an electron image signal y(t), wherein said microscope comprises:
    restoration means for obtaining a restoration waveform image signal x(t) by processing said electron image signal y(t) in accordance with an equation h(t) process resulting from an inverse Laplace transformation for an inverse function H(s) of a transfer function G(s) which approximates the response delay characteristics of said image detection system so as to recover the deterioration of the detected image signal y(t) provided by the image detection system; and,
    means for recognizing the pattern of the sample by the restoration waveform image signal x(t).

8. The scanning electron microscope according to claim 7, wherein said transfer function G(s) approximates in terms of a sum and/or product of first-order delay elements.

9. The scanning electron microscope according to claim 7, wherein said equation h(t) process performs a n-th order differentiation process, where n is a natural number, and a convolution process.

10. The scanning electron microscope according to claim 7, wherein said image detection system provides a scintillator which converts the electron image to a light image.

11. The scanning electron microscope according to claim 10 wherein said image detection system is further provided with a photoelectron multiplying tube which converts a light image to an electrical image.

12. A scanning electron microscope with a sharply converged electron beam operating to scan a sample and detect reflected electrons, secondary electrons or transmitted electrons by an image detection system to provide an electron image signal y(t), wherein said microscope comprises:

noise elimination means for eliminating a noise in the electron image signal y(t) detected by said image detection system by smooth-processing in a nonlinear fashion the electron image signal y(t);

restoration means for obtaining a restoration waveform image signal x(t) by processing said noise eliminated electron image signal y(t) in accordance with an equation h(t) process resulting from an inverse Laplace transformation for an inverse function H(s) of a transfer function G(s) which approximated the response delay characteristics of said image detection system so as to recover the deterioration of the detected image signal y(t) provided by the image detection system; and, means for recognizing the pattern of the sample by the restoration waveform image signal x(t).

13. The scanning electron microscope according to claim 12, wherein said transfer function G(s) approximates in terms of a sum and/or product of first order delay elements.

14. The scanning electron microscope according to claim 12, wherein said equation h(t) process performs a n-th order differentiation process, where n is a natural number, and a convolution process.

15. The scanning electron microscope according to claim 12, wherein said noise elimination means comprises a smoothing filter for smoothed-processing said electron image signal y(t) when the signal level variation of the electron image signal y(t) within a local region is small and means for directly delivering said electron image signal y(t) when the signal level variation of the electron image signal y(t) within a local region is large.

16. The scanning electron microscope according to claim 12, wherein said image detection system provides a scintillator which converts the electron image to a light image.

17. The scanning electron microscope according to claim 15 wherein said image detection system is further provided with the photoelectron multiplying tube which converts a light image to an electrical image.

18. A scanning electron microscope with a sharply converged electron beam operating to scan a sample and detect reflected electrons, secondary electrons or transmitted electrons by an image detection system to provide an electron image signal y(t), wherein said microscope comprises:

restoration means for obtaining a restoration waveform image signal x(t) by processing said electron image signal y(t) in accordance with an equation h(t) process resulting from the inverse Laplace transformation for an inverse function H(s) of a transfer function G(s) which approximated appropriately the response delay characteristics of said image detection system so as to recover the deterioration of the detected image signal y(t) provided by the image detection system;

means for obtaining an ideal image signal from design data; and, means for recognizing the pattern of the sample by comparing the restoration waveform image signal x(t) with an ideal image signal obtained from said obtained mean.

19. The scanning electron microscope according to claim 18 wherein said image detection system is provided with a scintillator which converts the electron image to a light image.

20. The scanning electron microscope according to claim 19 wherein said image detection system is further provided with the photoelectron multiplying tube which converts a light image to an electrical image.

21. A scanning electron microscope operating to scan a sample with a sharply converged electron beam and detect reflected electrons, secondary electrons or transmitted electrons by an image detection system to provide an electron image signal y(t), wherein said microscope comprises:

means for obtaining an ideal image signal from design data;

means for adding a transfer function G(s) which approximated appropriately the response delay characteristics of said image detection system, to said ideal image signal so as to recover the deterioration of the detected image signal y(t) provided by the image detection system; and, means for recognizing the pattern of the sample by comparing the electron image signal y(t) with said response delay ideal image signal obtained from said adding means.

22. The scanning electron microscope according to claim 21 wherein said image detection system is provided with a scintillator which converts the electron image to a light image.

23. The scanning electron microscope according to claim 22 wherein said image detection system is further provided with a photoelectron multiplying tube which converts a light image to an electrical image.

* * * * *